US012328112B2

United States Patent
Sun et al.

(10) Patent No.: US 12,328,112 B2
(45) Date of Patent: Jun. 10, 2025

(54) NON-OVERLAPPING GENERATION TECHNIQUE FOR BOOTSTRAP SWITCHES

(71) Applicant: QUALCOMM Incorporated, San Diego, CA (US)

(72) Inventors: Lei Sun, San Diego, CA (US); Yongjian Tang, San Diego, CA (US); Honghao Ji, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 62 days.

(21) Appl. No.: 18/307,441

(22) Filed: Apr. 26, 2023

(65) Prior Publication Data

US 2024/0364325 A1    Oct. 31, 2024

(51) Int. Cl.
*H03K 17/06* (2006.01)
*H03K 17/16* (2006.01)

(52) U.S. Cl.
CPC ......... *H03K 17/162* (2013.01); *H03K 17/063* (2013.01)

(58) Field of Classification Search
CPC ......... H03K 17/162; H03K 2217/0081; H03K 17/063; H03K 19/01714; H03K 19/01721; H03K 19/017; H03K 19/01707; H03K 19/01; H03K 19/01735; H03K 19/01728; H03K 19/01742; G11C 27/02; H03M 1/0836; H03M 1/1245; H03M 1/121

See application file for complete search history.

(56) References Cited

U.S. PATENT DOCUMENTS

| 9,147,497 | B1 | 9/2015 | Oo |
| 9,419,639 | B1 | 8/2016 | Hu et al. |
| 10,680,596 | B1 | 6/2020 | Sun et al. |
| 2005/0258874 | A1* | 11/2005 | Kudo .................. H03K 17/063 327/91 |
| 2006/0202735 | A1 | 9/2006 | Aksin et al. |

(Continued)

FOREIGN PATENT DOCUMENTS

| CN | 100568689 C | 12/2009 |
| CN | 113872602 A | 12/2021 |

(Continued)

OTHER PUBLICATIONS

Abo A.M., et al., "A 1.5-V, 10-bit, 14.3-MS/s CMOS Pipeline Analog-to-Digital Converter," IEEE Journal of Solid-State Circuits, vol. 34, No. 5, May 1999, pp. 599-606.

(Continued)

*Primary Examiner* — Jung Kim
(74) *Attorney, Agent, or Firm* — Loza & Loza, LLP

(57) ABSTRACT

A system includes a bootstrap circuit having an input and an output. The bootstrap circuit includes a boost capacitor having a first terminal and a second terminal, a first transistor coupled between the first terminal of the boost capacitor and the output of the bootstrap circuit, a second transistor, and a third transistor, wherein the second transistor and the third transistor are coupled in series between a gate of the first transistor and the second terminal of the boost capacitor. The system also includes a switch transistor, wherein a gate of the switch transistor is coupled to the output of the bootstrap circuit, and a terminal of the switch transistor is coupled to the input of the bootstrap circuit.

17 Claims, 14 Drawing Sheets

(56) References Cited

U.S. PATENT DOCUMENTS

| | | |
|---|---|---|
| 2010/0253394 A1 | 10/2010 | Tran |
| 2011/0018589 A1 | 1/2011 | Lee et al. |
| 2012/0262316 A1 | 10/2012 | Strode |
| 2014/0266392 A1 | 9/2014 | Devarajan et al. |
| 2015/0109161 A1 | 4/2015 | Trampitsch |
| 2015/0311895 A1 | 10/2015 | Ali |
| 2016/0027528 A1 | 1/2016 | Verbruggen et al. |
| 2018/0076808 A1 | 3/2018 | Singer |
| 2019/0214983 A1 | 7/2019 | Luo |
| 2019/0296756 A1 | 9/2019 | Ali |
| 2019/0305791 A1 | 10/2019 | Ali et al. |
| 2019/0363725 A1 | 11/2019 | Tsai |
| 2021/0281269 A1 | 9/2021 | Li et al. |
| 2021/0409015 A1 | 12/2021 | Cascio et al. |
| 2024/0305296 A1 | 9/2024 | Sun et al. |

FOREIGN PATENT DOCUMENTS

| | | |
|---|---|---|
| CN | 114374388 A | 4/2022 |
| JP | 2006033794 A | 2/2006 |
| TW | 201812861 A | 4/2018 |
| WO | 2020139460 A1 | 7/2020 |

OTHER PUBLICATIONS

International Search Report and Written Opinion—PCT/US2024/018371—ISA/EPO—Jun. 11, 2024.

\* cited by examiner

NON-OVERLAPPING GENERATION TECHNIQUE FOR BOOTSTRAP SWITCHES

BACKGROUND

Field

Aspects of the present disclosure relate generally to switches, and, more particularly, to bootstrap switches.

Background

A system may include bootstrap switches for selectively blocking or passing signals in two or more channels of the system. To reduce crosstalk between the channels, timing circuits (e.g., clock paths) may be used to generate non-overlapping clock signals for timing switching operations of the bootstrap switches. A challenge with implementing the timing circuits is that the timing circuits include delay circuits and clock drivers, which introduce jitter/skew into the non-overlapping clock signals, degrading performance.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a bootstrap circuit having an input and an output. The bootstrap circuit includes a boost capacitor having a first terminal and a second terminal, a first transistor coupled between the first terminal of the boost capacitor and the output of the bootstrap circuit, a second transistor, and a third transistor, wherein the second transistor and the third transistor are coupled in series between a gate of the first transistor and the second terminal of the boost capacitor. The system also includes a switch transistor, wherein a gate of the switch transistor is coupled to the output of the bootstrap circuit, and a terminal of the switch transistor is coupled to the input of the bootstrap circuit.

A second aspect relates to a system. The system includes a bootstrap circuit having an input and an output. The bootstrap circuit includes a boost capacitor having a first terminal and a second terminal, a first transistor coupled between the first terminal of the boost capacitor and the output of the bootstrap circuit, a second transistor coupled between a gate of the first transistor and the second terminal of the boost capacitor, a first switch coupled between the output of the bootstrap circuit and a ground, and a timing circuit. The timing circuit includes a logic gate having a first input, a second input, and an output, wherein the first input of the logic gate is coupled to an input of the timing circuit, and the output of the logic gate is coupled to a gate of the second transistor. The timing circuit also includes a clock path coupled between the input of the timing circuit and the second input of the logic gate, wherein a control input of the first switch is coupled to the clock path. The system also includes a switch transistor, wherein a gate of the switch transistor is coupled to the output of the bootstrap circuit, and a terminal of the switch transistor is coupled to the input of the bootstrap circuit.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A switch transistor may be used in a signal path to selectively block or pass a signal in the signal path. As used herein, a "switch transistor" is a transistor that is used as a switch. A switch transistor may be implemented with an n-type field effect transistor (NFET), or another type of transistor. The on/off state of a switch transistor may be controlled by controlling the voltage at the gate of the switch transistor. For the example of a switch transistor implemented with an NFET, the switch transistor may be turned on by applying a high voltage to the gate of the switch transistor, and the switch transistor may be turned off by applying a low voltage to the gate of the switch transistor. The switch transistor has an on resistance, which is the resistance across the switch transistor when the switch transistor is turned on (i.e., switched on).

A challenge with using a switch transistor to selectively pass or block a signal in a signal path is that the on resistance of the switch transistor depends on the gate-to-source voltage of the switch transistor. This dependance causes the on resistance of the switch transistor to vary when the voltage of the signal in the signal path varies. The varying on resistance of the switch transistor causes distortion in the signal in the signal path.

Figure 1:
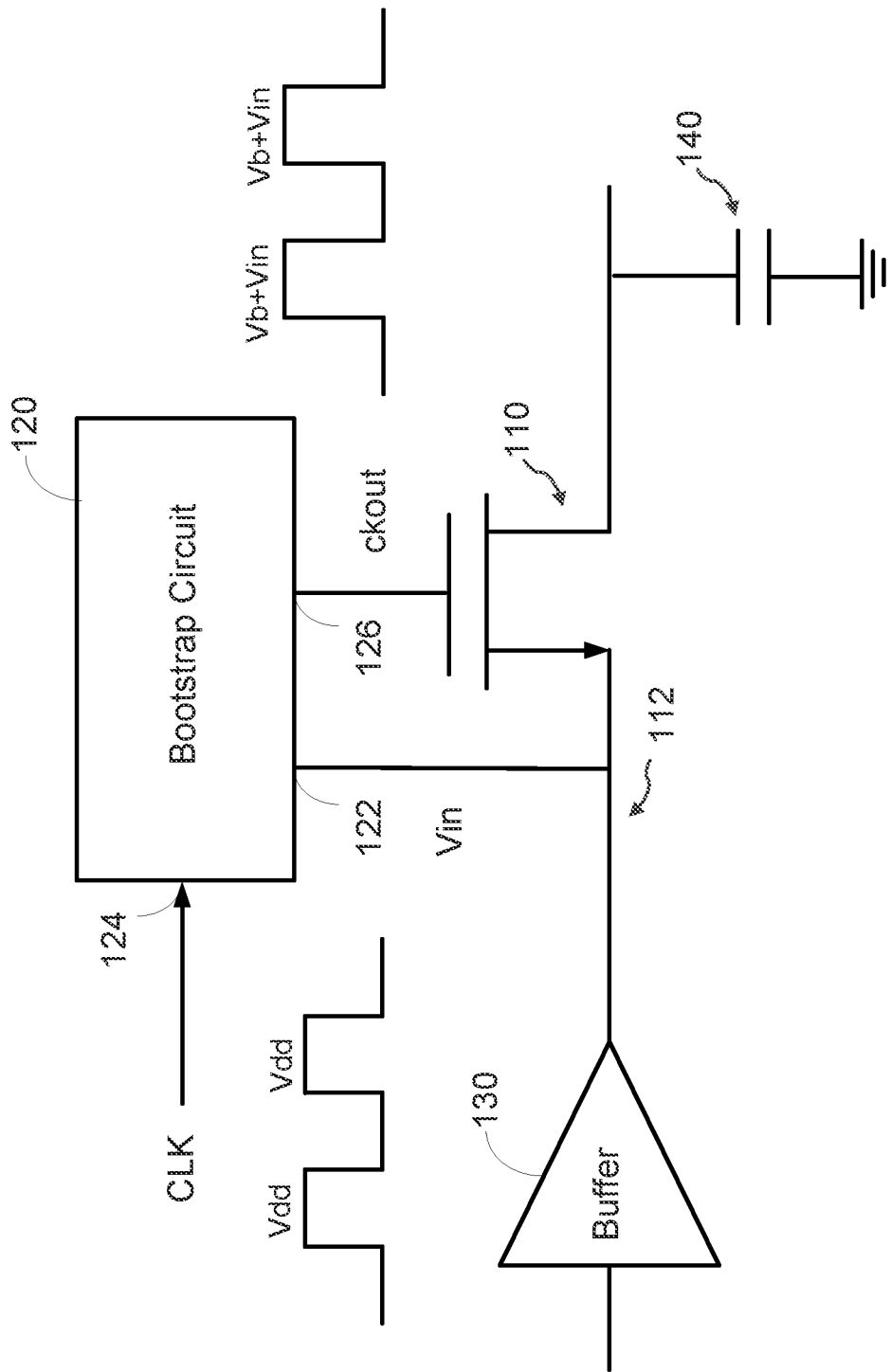
FIG. 1 shows an example of a bootstrap circuit and a switch transistor according to certain aspects of the present disclosure.

To address the voltage-dependent on resistance of the switch transistor, a bootstrap circuit may be used. In this regard, FIG. 1 shows an example of a switch transistor 110 and a bootstrap circuit 120 according to certain aspects. In the example in FIG. 1, the switch transistor 110 is implemented with an NFET. However, it is to be appreciated that the switch transistor 110 may be implemented with another type of transistor such as a p-type field effect transistor (PFET).

The switch transistor 110 is used to selectively pass or block a signal in a signal path 112. In the example in FIG. 1, the signal path 112 is between the output of a buffer 130 and a sampling capacitor 140. The sampling capacitor 140 may be used in an analog-to-digital converter (ADC), a capacitive digital-to-analog converter (DAC), or another type of circuit to sample the signal. However, it is to be appreciated that the disclosure is not limited to these examples. It is also to be appreciated that the sampling capacitor 140 may be implemented with multiple capacitors (e.g., coupled in parallel) in some implementations.

The bootstrap circuit 120 is configured to switch the switch transistor 110 on and off based on a clock signal CLK. The bootstrap circuit 120 has an input 122 coupled to a terminal (e.g., a source) of the switch transistor 110, a clock input 124 configured to receive the clock signal CLK, and an output 126 coupled to the gate of the switch transistor 110. The clock signal CLK may have an amplitude equal to a supply voltage Vdd, as shown in the example in FIG. 1.

The bootstrap circuit 120 is configured to receive the voltage Vin of the signal at the terminal (e.g., the source) of the switch transistor 110, generate an output clock signal ckout based on the clock signal CLK and the voltage Vin, and output the output clock signal ckout to the gate of the switch transistor 110 to switch the switch transistor 110 on and off. The output clock signal ckout may have a period approximately equal to a period of the clock signal CLK. The output clock signal ckout has an amplitude equal to Vb+Vin where Vb is a boost voltage (also referred to as an offset voltage). Thus, the output clock signal ckout boosts the voltage Vin by the boost voltage Vb when the output clock signal ckout is high. The boost voltage Vb may be greater than the threshold voltage of the switch transistor 110 to turn on the switch transistor 110 when the output clock signal ckout is high. In one example, the boost voltage Vb is approximately equal to the supply voltage Vdd. In this example, the amplitude of the output clock signal ckout is approximately equal to Vdd+Vin. The output clock signal ckout may have a voltage approximately equal to ground potential when the output clock signal ckout is low.

Thus, the voltage at the gate of the switch transistor 110 is equal to Vb+Vin and the voltage at the terminal (e.g., the source) of the switch transistor 110 is equal to Vin when the output clock signal ckout is high. This causes the gate-to-source voltage VGS of the switch transistor 110 to be approximately constant at Vb (i.e., VGS=Vb+Vin−Vin, which simplifies to Vb). The constant gate-to-source voltage VGS causes the on resistance of the switch transistor 110 to be approximately constant for good linearity. In this example, the switch transistor 110 is turned on during high phases of the output clock signal ckout (i.e., when the output clock signal ckout is high), and turned off during low phases of the output clock signal ckout (i.e., when the output clock signal ckout is low).

Figure 2:
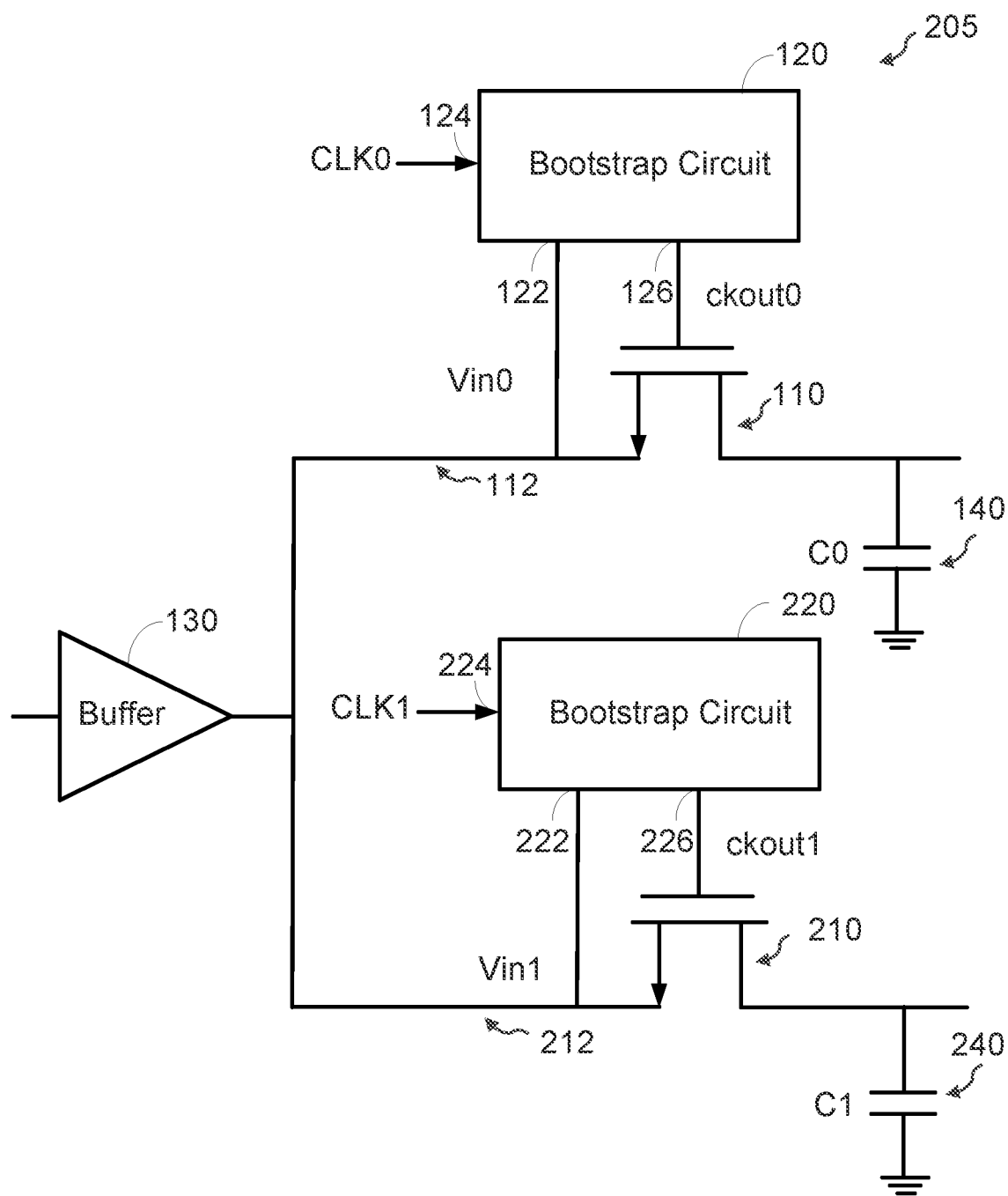
FIG. 2 shows an example of a system including switch transistors and bootstrap circuits according to certain aspects of the present disclosure.

Two or more switch transistors and two or more bootstrap circuits may be used to implement time-interleaved channels. In this regard, FIG. 2 shows an example of a system 205 with two time-interleaved channels according to certain aspects of the present disclosure. The system 205 includes the switch transistor 110, the bootstrap circuit 120, the buffer 130, and the sampling capacitor 140 discussed above. The system 205 also includes a second switch transistor 210, a second bootstrap circuit 220, and a second sampling capacitor 240. In the discussion below, the switch transistor 110 is referred to as the first switch transistor, the bootstrap circuit 120 is referred to as the first bootstrap circuit, the sampling capacitor 140 is referred to as the first sampling capacitor 140, and the signal path 112 is referred to as the first signal path.

In this example, the second switch transistor 210 is used to selectively pass or block a signal in a second signal path 212. The second signal path 212 is between the output of the buffer 130 and the second sampling capacitor 240. The second sampling capacitor 240 may be used in an ADC, a capacitive DAC, or another type of circuit to sample the signal in the second signal path 212. It is also to be appreciated that the second sampling capacitor 240 may be implemented with multiple capacitors (e.g., coupled in parallel) in some implementations. The second bootstrap circuit 220 has an input 222 coupled to a terminal (e.g., a source) of the second switch transistor 210, a clock input 224, and an output 226 coupled to the gate of the second switch transistor 210. The second bootstrap circuit 220 may be a second instance (i.e., copy) of the first bootstrap circuit 120 in some implementations.

In this example, the first switch transistor 110 and the first bootstrap circuit 120 are used for sampling the signal in the first signal path 112 (also referred to as a first channel), and the second switch transistor 210 and the second bootstrap circuit 220 are used for sampling the signal in the second signal path 212 (also referred to as a second channel). In FIG. 2, the signals associated with the first switch transistor 110 and the first bootstrap circuit 120 are appended with "0" and the signals associated with the second switch transistor 210 and the second bootstrap circuit 220 are appended with "1".

During operation, the first bootstrap circuit 120 receives a first clock signal CLK0 at the respective clock input 124, and the second bootstrap circuit 220 receives a second clock signal CLK1 at the respective clock input 224. In certain aspects, the second clock signal CLK1 may be the complement of the first clock signal CLK0 to provide time interleaving of the two channels, as discussed further below.

The first bootstrap circuit 120 receives the first clock signal CLK0 and the voltage Vin0 of the signal at the terminal (e.g., the source) of the first switch transistor 110. The first bootstrap circuit 120 generates the output clock signal ckout0 based on the first clock signal CLK0 and the voltage Vin0, and outputs the output clock signal ckout0 to the gate of the first switch transistor 110 to switch the first switch transistor 110 on and off. The output clock signal ckout0 has a voltage of approximately Vb+Vin0 when the output clock signal ckout0 is high.

The second bootstrap circuit 220 receives the second clock signal CLK1 and the voltage Vin1 of the signal at the terminal (e.g., the source) of the second switch transistor 210. The second bootstrap circuit 220 generates the output clock signal ckout1 based on the second clock signal CLK1 and the voltage Vin1, and outputs the output clock signal ckout1 to the gate of the second switch transistor 210 to switch the second switch transistor 210 on and off. The output signal ckout1 has a voltage of approximately Vb+Vin1 when the output clock signal ckout1 is high.

Because the first clock signal CLK0 and the second clock signal CLK1 are complementary, the output clock signals ckout0 and ckout1 are alternately high. As a result, the first switch transistor 110 and the second switch transistor 210 are alternately turned on by the output clock signals ckout0 and ckout1 (i.e., the first switch transistor 110 and the second switch transistor 210 are time-interleaved).

Figure 3:
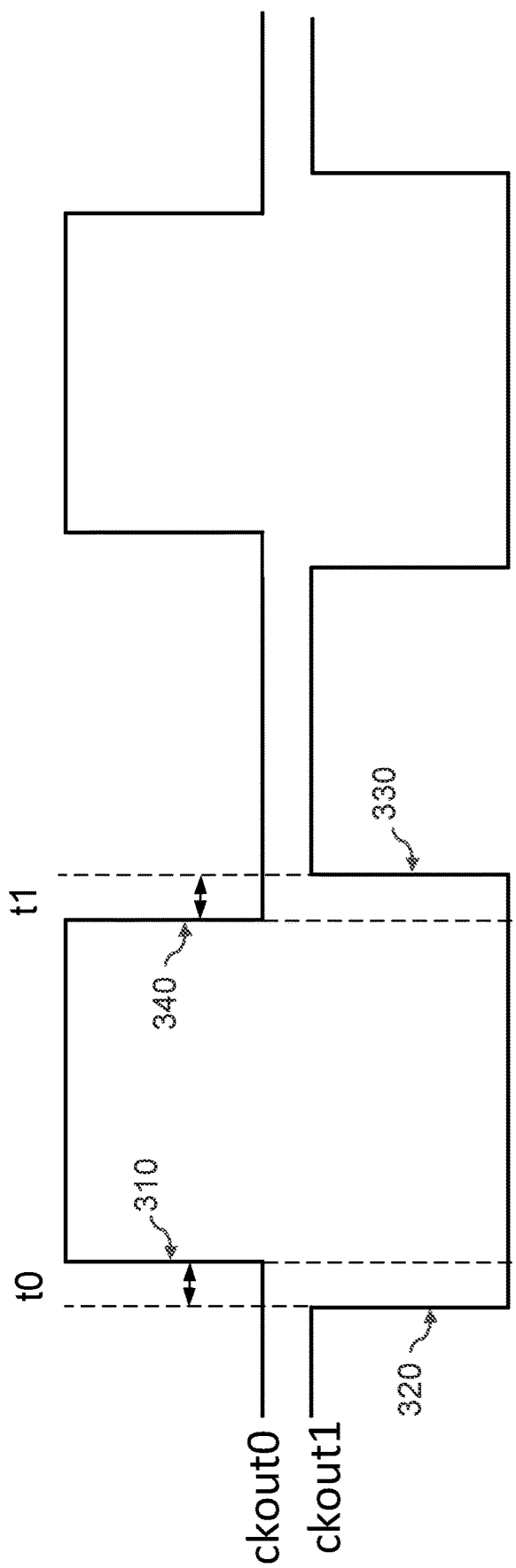
FIG. 3 is a timing diagram showing an example of output clock signals of the bootstrap circuit of FIG. 2 according to certain aspects of the present disclosure.

FIG. 3 is a timing diagram showing an example of the output clock signals ckout0 and ckout1 according to certain aspects. In this example, the rising edge 310 of the output clock signal ckout0 is delayed with respect to the falling edge 320 of the output clock signal ckout1 by time delay t0, and the rising edge 330 of the output clock signal ckout1 is delayed with respect to the falling edge 340 of the output clock signal ckout0 by time delay t1, as shown in FIG. 3. The time delays help ensure there is no overlap between the high phases of the output clock signal ckout0 and the high phases of the output clock signal ckout1. This prevents the first switch transistor 110 and the second switch transistor 210 from being turned on at the same time, which reduces crosstalk between the first channel and the second channel. The time delays t0 and t1 may be programmable in some implementations.

Figure 4:
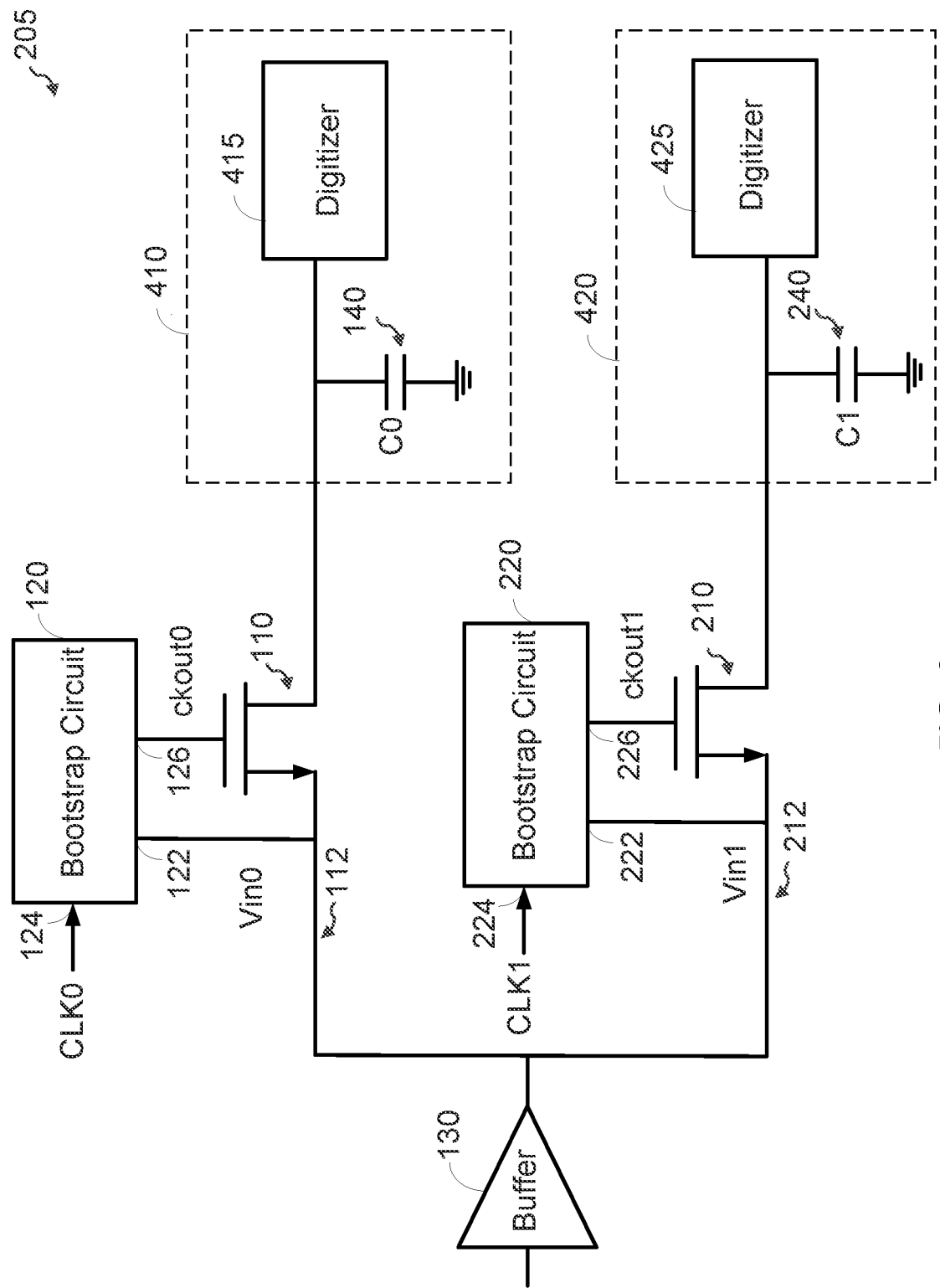
FIG. 4 shows an example of the system of FIG. 2 including analog-to-digital converters according to certain aspects of the present disclosure.

As discussed above, the sampling capacitors 140 and 240 may be used in ADCs. In this regard, FIG. 4 shows an example in which the system includes a first ADC 410 and a second ADC 420. In this example, the first ADC 410 includes the first sampling capacitor 140 and a first digitizer 415, and the second ADC 420 includes the second sampling capacitor 240 and a second digitizer 425.

In this example, the first sampling capacitor 140 samples the voltage of the signal in the first signal path 112 when the first switch transistor 110 is turned on by the output clock signal ckout0. When the first switch transistor 110 is turned off by the output clock signal ckout0, the first sampling capacitor 140 holds the voltage of the sampled signal, and the first digitizer 415 converts the held voltage into a first digital signal (e.g., a first digital code). In this example, the falling edge of the output clock signal ckout0 determines the sampling instance of the first sampling capacitor 140. This is because the first switch transistor 110 turns off on the falling edge of the output clock signal ckout0. As a result, the first sampling capacitor 140 holds the voltage of the signal in the first signal path 112 at the time of the falling edge of the output clock signal ckout0, and the first digitizer 415 converts this voltage into the first digital signal.

The second sampling capacitor 240 samples the voltage of the signal in the second signal path 212 when the second switch transistor 210 is turned on by the output clock signal ckout1. When the second switch transistor 210 is turned off by the output clock signal ckout1, the second sampling capacitor 240 holds the voltage of the sampled signal, and the digitizer 425 converts the held voltage into a second digital signal (e.g., a second digital code). In this example, the falling edge of the output clock signal ckout1 determines the sampling instance of the second sampling capacitor 240. This is because the second switch transistor 210 turns off on the falling edge of the output clock signal ckout1. As a result, the second sampling capacitor 240 holds the voltage of the signal in the second signal path 212 at the time of the falling edge of the output clock signal ckout1, and the second digitizer 425 converts this voltage into the second digital signal.

Figure 5A:
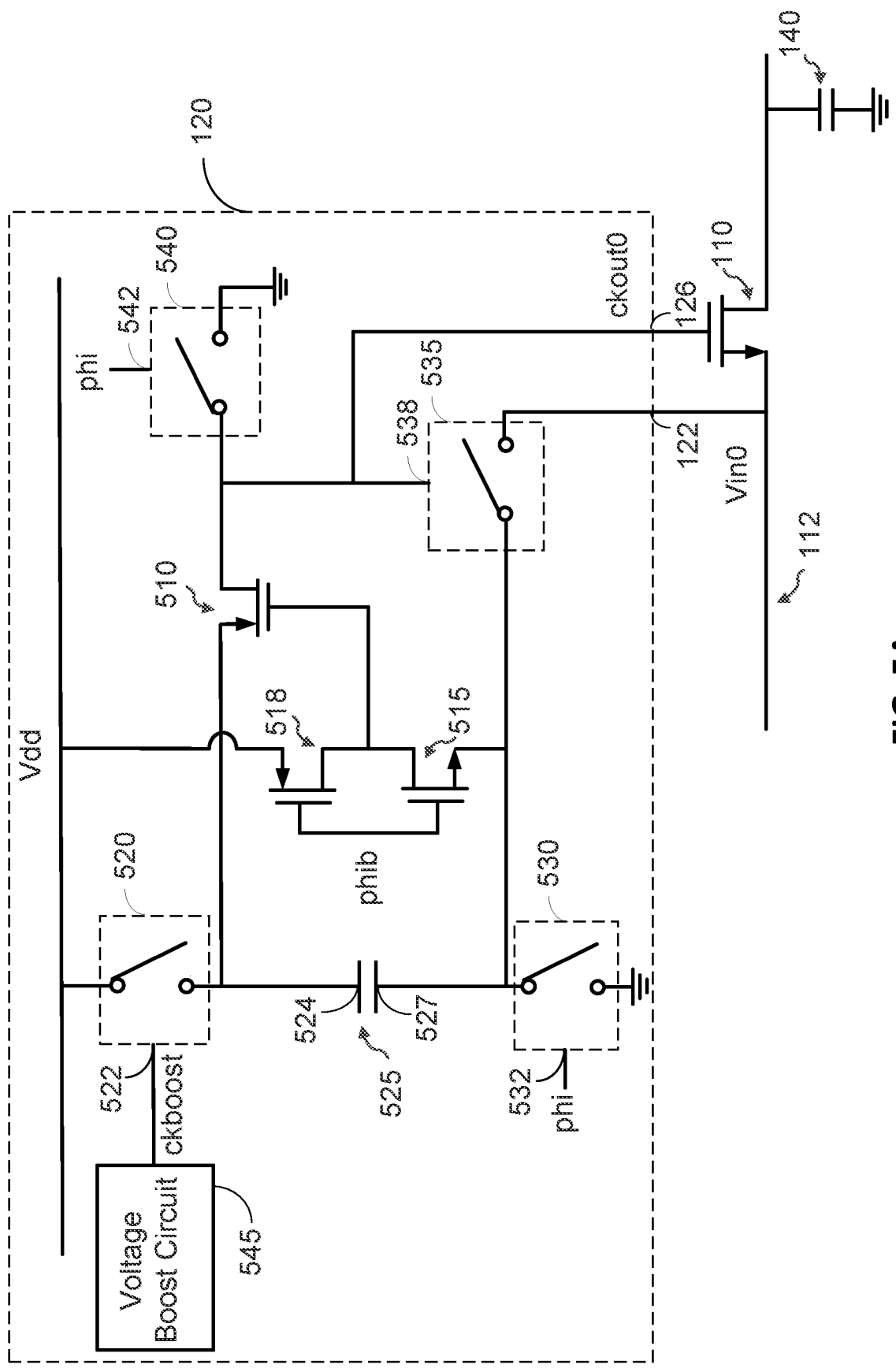
FIG. 5A shows an exemplary implementation of a bootstrap circuit according to certain aspects of the present disclosure.

FIG. 5A shows an exemplary implementation of the first bootstrap circuit 120 according to certain aspects. The exemplary implementation shown in FIG. 5A may also be used to implement the second bootstrap circuit 220.

In this example, the first bootstrap circuit 120 includes a boost capacitor 525, a first switch 520, a second switch 530, a third switch 535, and a fourth switch 540. Each of the switches 520, 530, 535, and 540 has a respective control input 522, 532, 538, and 542 for controlling the on/off state of the switch. Each of the switches 520, 530, 535, and 540 may be implemented with one or more respective transistors. As discussed further below, the on/off states of the switches 520, 530, 535, and 540 may be controlled by control signals (e.g., clock signals) that are generated from the clock signal CLK0.

In this example, the first switch 520 is coupled between a first terminal 524 of the boost capacitor 525 and a supply rail providing supply voltage Vdd. The second switch 530 is coupled between a second terminal 527 of the boost capacitor 525 and ground (also referred to as Vss). The third switch 535 is coupled between the second terminal 527 of the boost capacitor 525 and the input 122 of the first bootstrap circuit 120. The control input 538 of the third switch 535 is coupled to the output 126 of the first bootstrap circuit 120. The fourth switch 540 is coupled between the output 126 of the first bootstrap circuit 120 and ground. It is to be appreciated that a terminal of a capacitor may also be referred to as a plate, an electrode, or another term.

The first bootstrap circuit 120 also includes a transistor 510 coupled between the first terminal 524 of the boost capacitor 525 and the output 126 of the first bootstrap circuit 120. In this example, the source of the transistor 510 is coupled to the first terminal 524 of the boost capacitor 525, and the drain of the transistor 510 is coupled to the output 126 of the first bootstrap circuit 120. In the example shown in FIG. 5A, the transistor 510 is implemented with a p-type field effect transistor (PFET). However, it is to be appreciated that the transistor 510 may be implemented with another type of transistor.

The first bootstrap circuit 120 also includes a transistor 515 coupled between the gate of the transistor 510 and the second terminal 527 of the boost capacitor 525. In this example, the drain of the transistor 515 is coupled to the gate of the transistor 510, and the source of the transistor 515 is coupled to the second terminal 527 of the boost capacitor 525.

The first bootstrap circuit 120 also includes a transistor 518 coupled between the gate of the transistor 510 and the supply rail. In this example, the source of the transistor 518 is coupled to the supply rail, the drain of the transistor 518 is coupled to the gate of the transistor 510, and the gate of the transistor 518 is coupled to the gate of the transistor 515.

In the example shown in FIG. 5A, the transistor 515 is implemented with an n-type field effect transistor (NFET) and the transistor 518 is implemented with a PFET. However, it is to be appreciated that the present disclosure is not limited to this example.

The first bootstrap circuit 120 also includes a voltage boost circuit 545 coupled to the control input 522 of the first switch 520. As discussed further below, the voltage boost circuit 545 is configured to generate the control signal ckboost used to control the first switch 520.

Figure 5B:
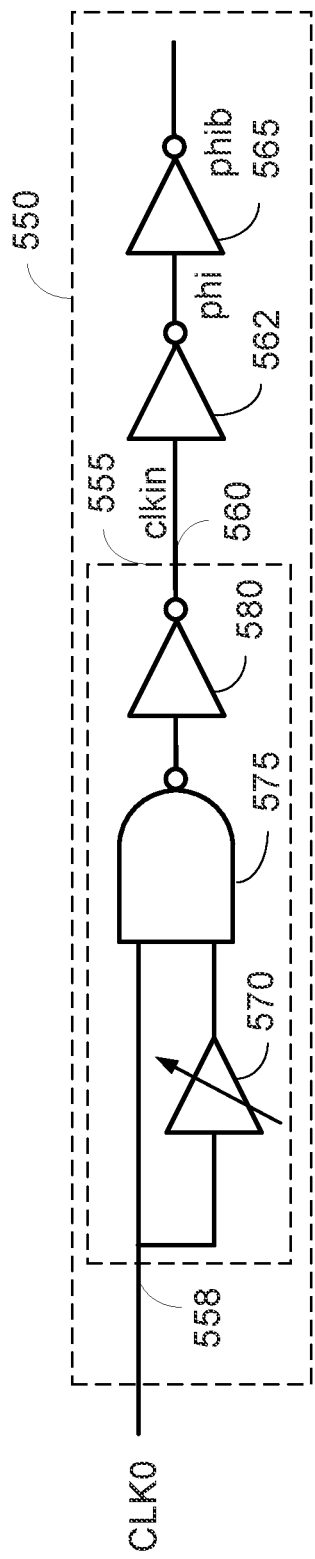
FIG. 5B shows an example of a timing circuit according to certain aspects of the present disclosure.

FIG. 5B shows an example of a timing circuit 550 (e.g., a clock path) configured to receive the clock signal CLK0 and generate control signals phi and phib (e.g., clock signals) based on the clock signal CLK0. The control signals phi and phib are used to control the on/off states of the switches 520, 530, 535, and 540 and the on/off states of the transistors 515 and 518, as discussed further below. The timing circuit 550 includes a rising-edge delay circuit 555, a first driver 562, and a second driver 565. In the example shown in FIG. 5B, each of the drivers 562 and 565 is implemented with a respective inverter. However, it is to be appreciated that the present disclosure is not limited to this example.

As used herein, a "driver" is a circuit that receives a signal (e.g., a clock signal) and drives a load (e.g., another driver, one or more switches, or any combination thereof) based on the signal. A driver may be inverting or non-inverting. For an example of a clock signal, a driver may also be referred to as a clock driver, a clock buffer, or another term.

The rising-edge delay circuit 555 has an input 558 configured to receive the clock signal CLK0 and an output 560. The rising-edge delay circuit 555 is configured to delay the rising edge of the clock signal CLK0 by a time delay (e.g., a programmable time delay). This is done to produce the time delay t0 between the rising edge 310 of the output clock signal ckout0 and the falling edge 320 of the output clock signal ckout1 discussed above to prevent overlap between the high phases of the output clock signal ckout0 and the high phases of the output clock signal ckout1.

In the example shown in FIG. 5B, the rising-edge delay circuit 555 includes a delay circuit 570, a NAND gate 575, and a driver 580 (e.g., an inverter). A first input of the NAND gate 575 is coupled to the input 558 of the rising-edge delay circuit 555, and the delay circuit 570 is coupled between the input 558 of the rising-edge delay circuit 555 and a second input of the NAND gate 575. The input of the driver 580 is coupled to the output of the NAND gate 575 and the output of the driver 580 is coupled to the output 560 of the rising-edge delay circuit 555. The rising-edge delay circuit 555 outputs a clock signal clkin based on the clock signal CLK0, in which the rising edge of the clock signal clkin is delayed with respect to the rising edge of the clock signal CLK0 by the delay circuit 570.

Figure 6:
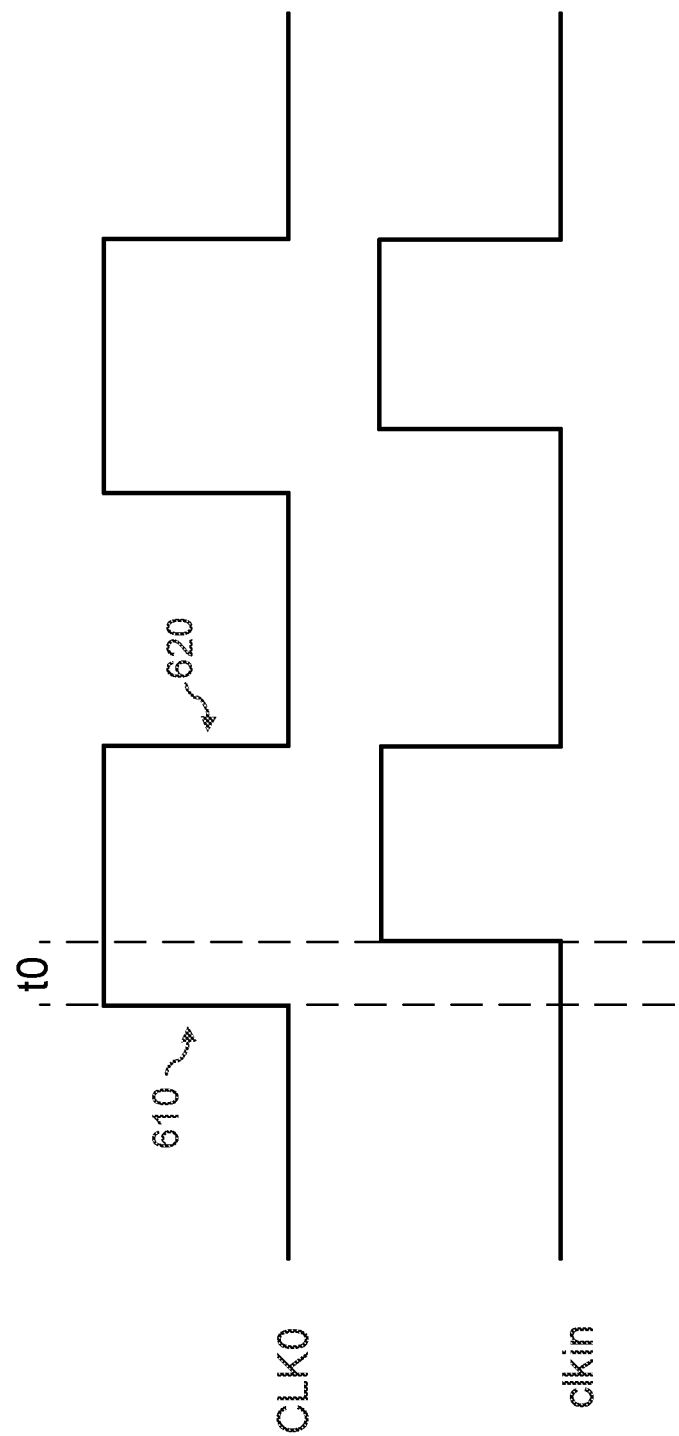
FIG. 6 is a timing diagram illustrating signals in the timing circuit of FIG. 5B according to certain aspects of the present disclosure.

FIG. 6 is a timing diagram showing an example of the clock signal CLK0 and the clock signal clkin according to certain aspects. As shown in FIG. 6, the rising-edge delay circuit 555 delays the rising edge 610 of the clock signal CLK0 by time delay t0, which is controlled by the delay of the delay circuit 570. This is because, when the rising edge 610 of the clock signal CLK0 is received at the input 558, the output 560 of the rising-edge delay circuit 555 does not transition from low to high until both inputs of the NAND gate 575 are high. This occurs when the rising edge of the clock signal CLK0 delayed by the delay circuit 570 reaches the second input of the NAND gate 575.

In the example in FIG. 6, the falling edge 620 of the clock signal CLK0 is not delayed (assuming the delays in the NAND gate 575 and the driver 580 are negligible compared to the delay of the delay circuit 570 for simplicity). This is because, when the falling edge 620 of the clock signal CLK0 is received at the input 558, the output 560 of the rising-edge delay circuit 555 transitions from high to low when the falling edge 620 of the clock signal CLK0 reaches the first input of the NAND gate 575 regardless of the logic state at the second input of the NAND gate 575. Although the delays in the NAND gate 575 and the driver 580 are assumed to be negligible in the example shown in FIG. 6 for simplicity, it is to be appreciated that this need not be the case.

Returning to FIG. 5B, the input of the first driver 562 is coupled to the output 560 of the rising-edge delay circuit 555, and the input of the second driver 565 is coupled to the output of the first driver 562. In this example, the control signals phi and phib are provided at the outputs of the first driver 562 and the second driver 565, respectively. The control signals phi and phib are complementary since the second driver 565 inverts the control signal phi to generate the control signal phib in this example. As shown in FIG. 5A, the control signal phi is input to the control inputs 532 and 542 of the second and fourth switches 530 and 540, and the control signal phib is input to the gates of the transistors 515 and 518. In this example, the second and fourth switches 530 and 540 are configured to turn on when the control signal phi is high (e.g., Vdd) and turn off when the control signal phi is low (e.g., zero volts)

In certain aspects, the voltage boost circuit 545 is configured to boost the voltage of the control signal phi to generate the control signal ckboost, which is input to the control input 522 of the first switch 520. For example, the voltage boost circuit 545 may boost the voltage of the control signal phi by the supply voltage Vdd to generate the control signal ckboost. In this example, the control signal phi may have a high voltage of approximately Vdd and a low voltage of approximately zero volts, and the control signal ckboost may have a high voltage of approximately 2Vdd and a low voltage of approximately Vdd. However, it is to be appreciated that the present disclosure is not limited to this example, and that the voltage boost circuit 545 may boost the voltage of the control signal phi by a different voltage to generate the control signal ckboost. In this example, the first switch 520 is configured to turn on when the control signal ckboost is high (e.g., 2Vdd) and turn off when the control signal ckboost is low (e.g., Vdd).

Exemplary operations of the first bootstrap circuit 120 will now be discussed according to certain aspects. During a first phase of the clock signal CLK0, the control signal phi is high (e.g., approximately Vdd), the control signal ckboost is high (e.g., approximately 2Vdd), and the control signal phib is low. This causes the first switch 520, the second switch 530, and the fourth switch 540 to turn on. As a result, the first terminal 524 of the boost capacitor 525 is coupled to the supply rail through the first switch 520, and the second terminal 527 of the boost capacitor 525 is coupled to ground through the second switch 530. This causes the first terminal 524 of the boost capacitor 525 to charge to the supply voltage Vdd. Also, the gate of the switch transistor 110 is coupled to ground through the fourth switch 540, which turns off the switch transistor 110. The control input 538 of the third switch 535 is also coupled to ground through the fourth switch 540, which turns off the third switch 535.

As discussed above, the control signal phib is low during the first phase. Thus causes the transistor 515 to turn off and the transistor 518 to turn on. As a result, the gate of the transistor 510 is coupled to the supply rail through the transistor 518. This turns off the transistor 510, which is implemented with a PFET in this example.

Thus, during the first phase, the boost capacitor 525 is charged to the supply voltage Vdd, and the switch transistor 110 is turned off. Also, the output clock signal ckout0 is approximately equal to zero volts during the first phase since the output 126 of the first bootstrap circuit 120 is coupled to ground through the fourth switch 540.

During a second phase of the clock signal CLK0 (which follows the first phase), the control signal phi transitions from high to low, the control signal ckboost transitions from high to low, and the control signal phib transitions from low to high. This causes the first switch 520, the second switch 530, and the fourth switch 540 to turn off. As a result, the first terminal 524 of the boost capacitor 525 is decoupled from the supply rail, and the second terminal 527 of the boost capacitor 525 is decoupled from ground. In addition, the output 126 of the first bootstrap circuit 120 is decoupled from ground.

As discussed above, the control signal phib transitions from low to high during the second phase. This causes the transistor 515 to turn on and the transistor 518 to turn off. As a result, the gate of the transistor 510 is coupled to the second terminal 527 of the boost capacitor 525 through the transistor 515. The source of the transistor 510 is coupled to the first terminal 524 of the boost capacitor 525. Thus, the source-to-gate voltage of the transistor 510 is approximately equal to the voltage across the boost capacitor 525. Since the boost capacitor 525 is charged to Vdd during the first phase, the source-to-gate voltage of the transistor 510 is approximately equal to Vdd. This turns on the transistor 510 assuming Vdd is greater than the threshold voltage of the transistor 510. As a result, the first terminal 524 of the boost capacitor 525 is coupled to the output 126 through the transistor 510.

The first terminal 524 of the boost capacitor 525 is also coupled to the control input 538 of the third switch 535 through the transistor 510, which turns on the third switch 535. As a result, the second terminal 527 of the boost capacitor 525 is coupled to the input 122 of the first bootstrap circuit 120 through the third switch 535. As a result, the input voltage Vin0 at the input 122 is applied to the second terminal 527 of the boost capacitor 525 through the third switch 535. This boosts the voltage at the first terminal 524 of the boost capacitor 525 to Vdd+Vin0. Since the first terminal 524 of the boost capacitor 525 is coupled to the output 126 of the first bootstrap circuit 120, the voltage of the output clock signal ckout0 at the output 126 is approximately equal to Vdd+Vin0 during the second phase, which turns on the switch transistor 115.

In this example, the rising edge of the output clock ckout0 is delayed by the delay circuit 570 in the timing circuit 550. This is because the delay circuit 570 delays the rising edge of the clock signal clkin by the delay of the delay circuit 570. This delays the transition of the control signal phi from high to low since the control signal phi is the inverse of the clock signal clkin, and delays the transition of the control signal phib from low to high, which delays the rising edge of the output clock signal ckout0.

In this example, the falling edge of the output clock signal ckout0 is determined at least in part by the time that the fourth switch 540 is turned on by the control signal phi. This is because turning on the fourth switch 540 couples the output 126 of the first bootstrap circuit 120 to ground, which causes the output clock signal ckout0 to transition from high to low (e.g., ground). As discussed above, the sampling instance of the sampling capacitor 140 is determined by the falling edge of the output clock signal ckout0. Therefore, the timing of the falling edge of the output clock signal ckout0 (which is controlled by the control signal phi) affects the sampling instance of the sampling capacitor 140.

A drawback of the timing circuit 550 shown in FIG. 5B is that the input clock signal CLK0 needs to propagate through three gates (i.e., the NAND gate 575 and the drivers 580 and 562) in the timing circuit 550 to provide the control signal phi, which controls the falling edge of the output clock signal ckout0. The three gates introduce jitter/skew into the control signal phi, and therefore introduce jitter/skew into the falling edge of the output clock signal ckout0 which degrades performance. Therefore, a need for improving the quality of the control signal phi to improve the timing of the falling edge of the output clock signal ckout0 is desirable.

Aspects of the present disclosure reduce jitter/skew in the falling edge of the output clock signal ckout0 compared with the timing circuit 550 in FIG. 5B by reducing the number of gates in the clock path of the control signal phi, as discussed further below. As used herein, a clock path is a path through which a clock signal propagates. A clock path may include one or more drivers, one or more delay circuits, or any combination thereof.

Figure 7A:
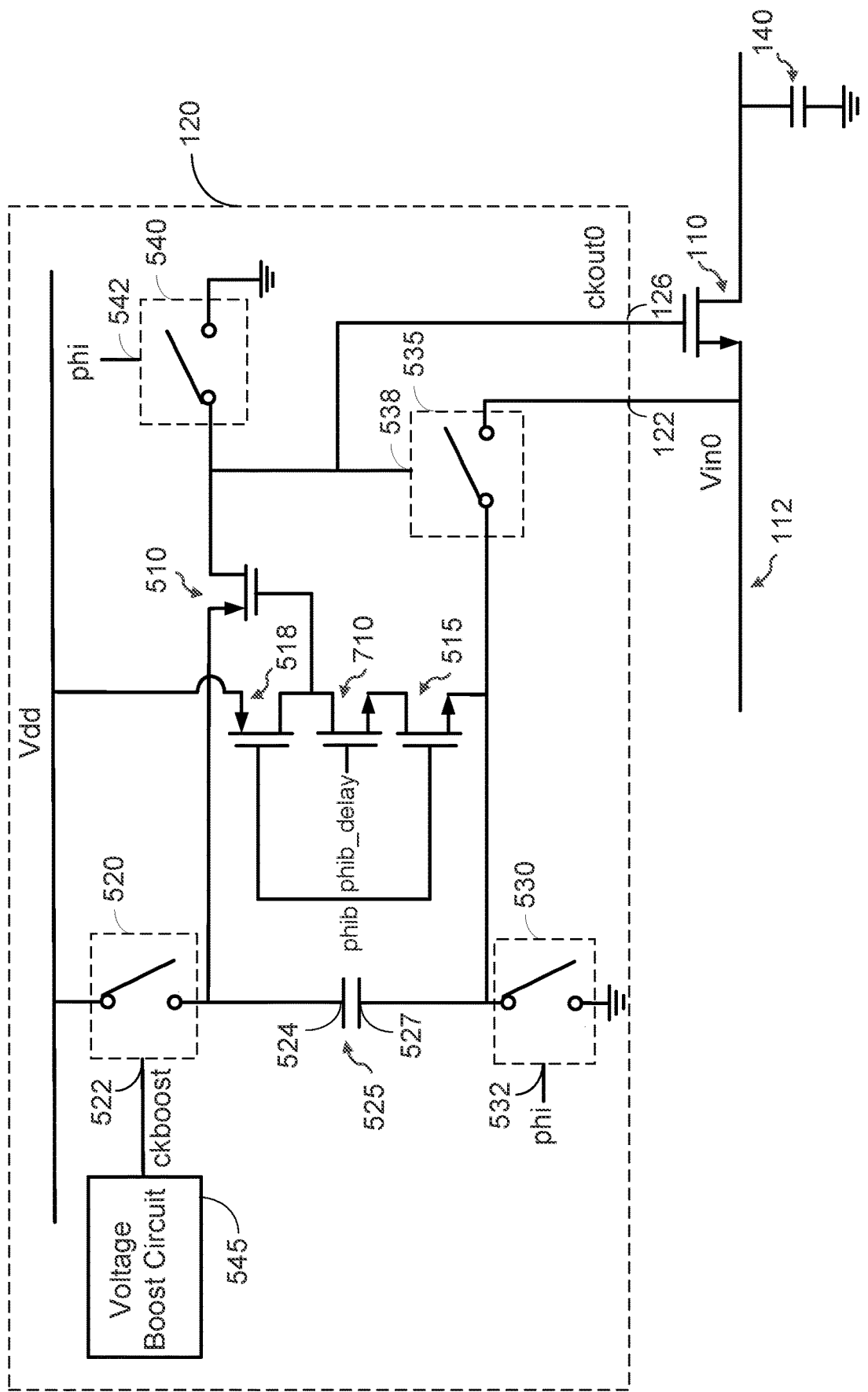
FIG. 7A shows another exemplary implementation of a bootstrap circuit according to certain aspects of the present disclosure.

FIG. 7A shows an example of the first bootstrap circuit 120 according to aspects of the present disclosure. In this example, the first bootstrap circuit 120 includes a transistor 710, in which the transistor 710 and the transistor 515 are coupled in series between the gate of the transistor 510 and the second terminal 527 of the boost capacitor 525. As used herein, transistors are coupled in series when the channels of the transistors are coupled in series. A channel of a transistor is between the source and the drain of the transistor in which the conductance of the channel is controlled by the voltage applied to the gate of the transistor.

The transistor 710 is used to delay the rising edge of the output clock signal ckout0, as discussed further below. In the example shown in FIG. 7A, the transistor 710 is implemented with an NFET. However, it is to be appreciated that the transistor 710 may be implemented with another type of transistor in other implementations.

Figure 7B:
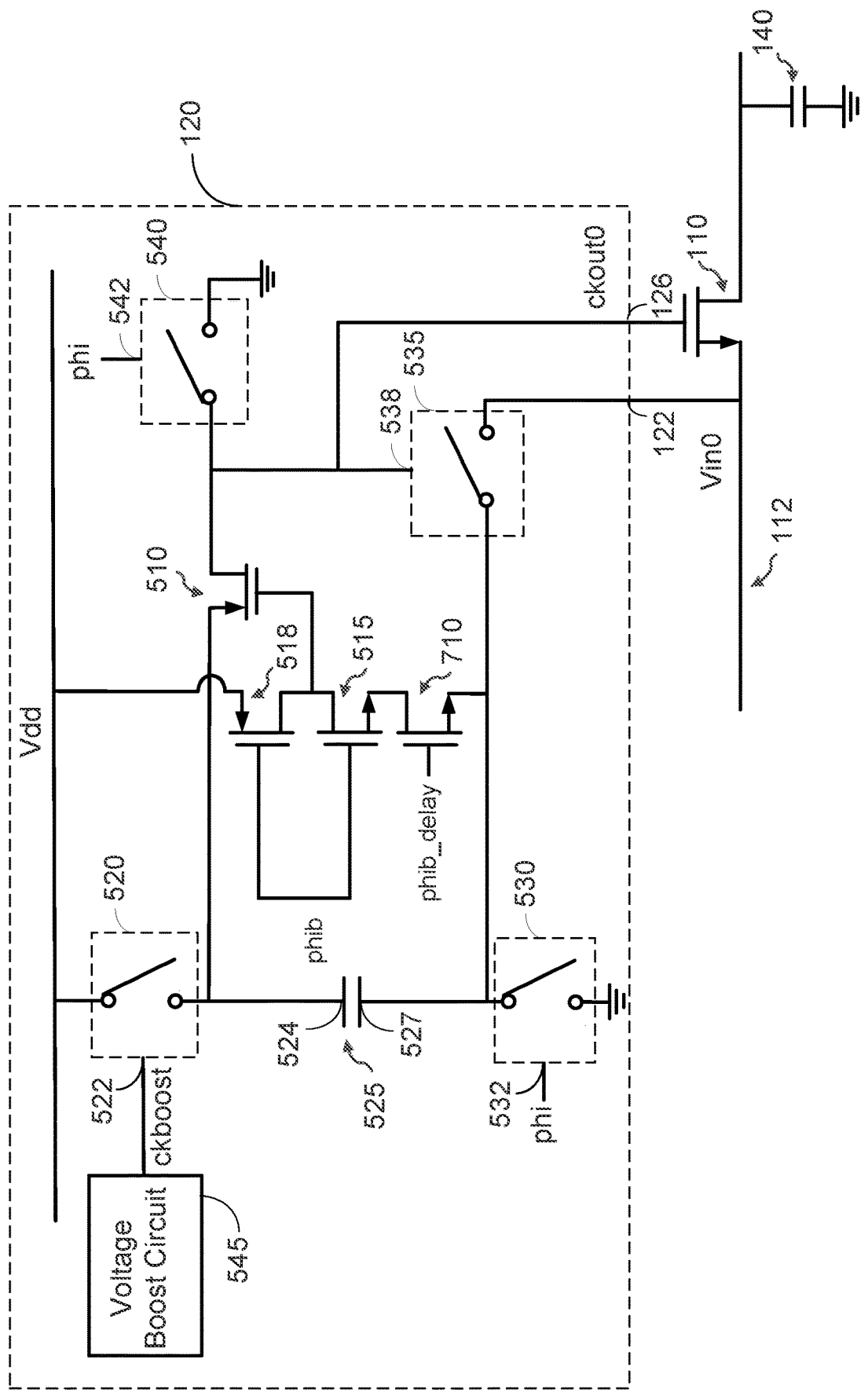
FIG. 7B shows yet another exemplary implementation of a bootstrap circuit according to certain aspects of the present disclosure.

Although FIG. 7A shows an example in which the transistor 710 is on top of the transistor 515, it is to be appreciated that the positions of the transistors 710 and 515 may be swapped in other implementations such that the transistor 515 is on top of the transistor 710. In this regard, FIG. 7B shows an example in which the transistor 515 is on top of the transistor 710. In both FIG. 7A and FIG. 7B, the transistor 710 and the transistor 515 are coupled in series between the gate of the transistor 510 and the second terminal 527 of the boost capacitor 525.

Figure 7C:
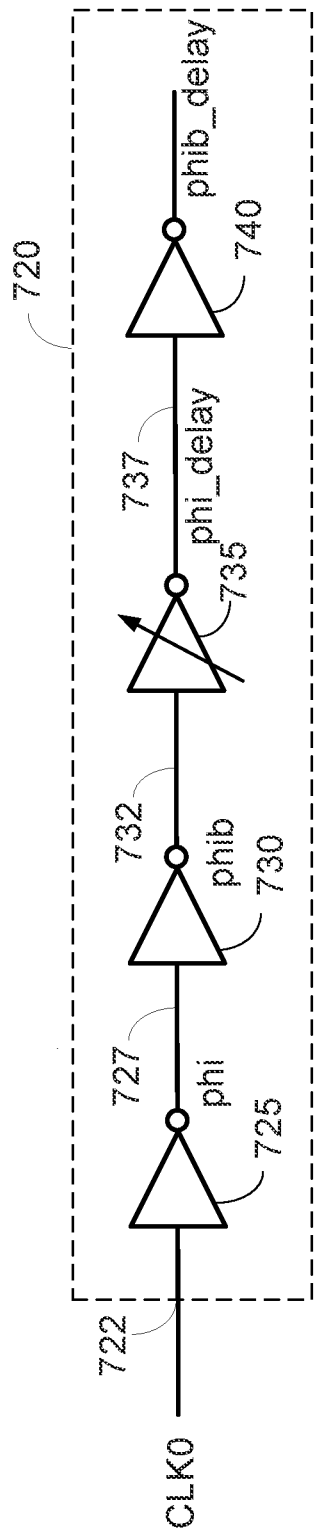
FIG. 7C shows another example of a timing circuit according to certain aspects of the present disclosure.

FIG. 7C shows an example of a timing circuit 720 (e.g., a clock path) for generating the control signals phi and phib. The timing circuit 720 includes a first driver 725, a second driver 730, a delay circuit 735, and a third driver 740. The input of the first driver 725 is coupled to an input 722 of the timing circuit 720 and is configured to receive the clock signal CLK0. The input of the second driver 730 is coupled to the output of the first driver 725, the input of the delay circuit 735 is coupled to the output of the second driver 730, and the input of the third driver 740 is coupled to the output of the delay circuit 735. In the example shown in FIG. 7C, each of the drivers 725, 730, and 740 is implemented with a respective inverter. However, it is to be appreciated that the present disclosure is not limited to this example.

In this example, the control signal phi (which controls the falling edge of the output clock signal ckout0) is taken from a node 727 at the output of the first driver 725, and the control signal phib is taken from a node 732 at the output of the second driver 730. In this example, the node 727 is coupled to the control inputs 532 and 542 of the second and fourth switches 530 and 540 shown in FIGS. 7A and 7B to provide the control inputs 532 and 542 with the control signal phi, and the node 732 is coupled to the gates of the transistors 515 and 518 to provide the gates of the transistors 515 and 518 with the control signal phib.

In this example, the clock signal CLK0 propagates through one gate (i.e., the first driver 725) to generate the control signal phi instead of the three gates shown in the timing circuit 550 in FIG. 5B. This significantly reduces the introduction of jitter/skew into the control signal phi, and hence significantly reduces jitter/skew in the falling edge of the output clock signal ckout0 (which is controlled by the turning on of the fourth switch 540 by the control signal phi).

In this example, the clock signal CLK0 propagates to the delay circuit 735 where the clock signal CLK0 is delayed by the delay circuit 735 and inverted by the third driver 740 to generate control signal phib_delay at node 737. The control signal phib_delay is input to the gate of the transistor 710 (i.e., the gate of the transistor 710 is coupled to the node 737). The transistor 710 delays the rising edge of the output clock signal ckout0 based on the delay in the control signal phib_delay, which is controlled by the delay circuit 735. This is because the transistor 710 is coupled in series with the transistor 515. As a result, the transistor 710 does not allow the transistor 515 to couple the gate of the transistor 510 to the second terminal 527 of the boost capacitor 525 until the transistor 710 is turned on by the control signal phib_delay, which is delayed by the delay circuit 735. Thus, in this example, the delay circuit 735 and the transistor 710 perform the function of delaying the rising edge of the output clock signal ckout, which is performed by the delay circuit 570 and the NAND gate 575 in FIG. 5B.

As shown in FIG. 7C, the delay circuit 735 and the drivers 730 and 740 are located after the control signal phi in the timing circuit 720, and therefore do not introduce jitter/skew into the control signal phi, which controls the falling edge of the output clock signal ckout0. In contrast, in the timing circuit 550 in FIG. 5B, the NAND gate 575 and the drivers 580 and 562 are located before the control signal phi, and therefore introduce jitter/skew into the control signal phi.

It is to be appreciated that the timing circuit 720 is not limited to the example shown in FIG. 7C. In general, the timing circuit 720 (e.g., a clock path) may include one or more drivers (e.g., one or more inverters) and the delay circuit 735 coupled in series, in which the node 727 that provides the control signal phi for the fourth switch 540 is located before the delay circuit 735, and the node 737 that provides the control signal phi_delay for the transistor 710 is located after the delay circuit 735.

Figure 8:
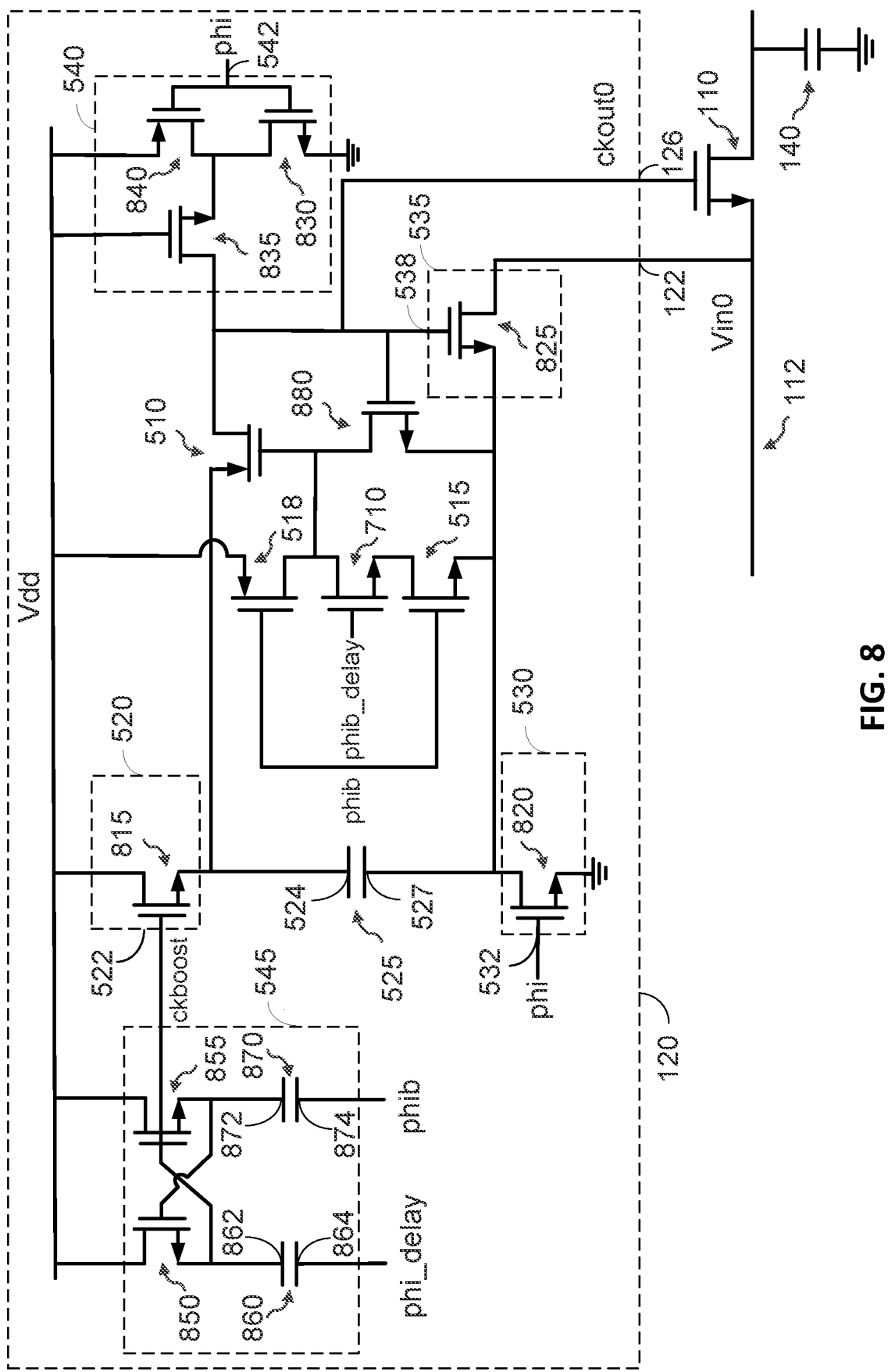
FIG. 8 shows an exemplary implementation of switches and a voltage boost circuit according to certain aspects of the present disclosure.

FIG. 8 shows an exemplary implementation of the switches 520, 530, 535, and 540 according to certain aspects. In this example, the first switch 520 includes a transistor 815 (e.g., NFET) where the drain of the transistor 815 is coupled to the supply rail, the gate of the transistor 815 is coupled to the voltage boost circuit 545, and the source of the transistor 815 is coupled to the first terminal 524 of the boost capacitor 525. The second switch 530 includes a transistor 820 (e.g., NFET) where the drain of the transistor 820 is coupled to the second terminal 527 of the boost capacitor 525, the gate of the transistor 820 is coupled to the control input 532 of the second switch 530 (and hence receives the control signal phi), and the source of the transistor 820 is coupled to ground. The third switch 535 includes a transistor 825 (e.g., NFET) where the source of the transistor 825 is coupled to the second terminal 527 of the boost capacitor 525, the gate of the transistor 825 is coupled to the output 126 of the first bootstrap circuit 120, and the drain of the transistor 825 is coupled to the input 122 of the first bootstrap circuit 120.

In this example, the fourth switch 540 includes a first transistor 830 (e.g., first NFET), a second transistor 835 (e.g., second NFET), and a third transistor 840 (e.g., PFET). The gate of the first transistor 830 is coupled to the control input 542 of the fourth switch 540 (and hence receives the control signal phi), and the source of the first transistor 830 is coupled to ground. The drain of the second transistor 835 is coupled to the output 126 of the first bootstrap circuit 120, the gate of the second transistor 835 is coupled to the supply rail, and the source of the second transistor 835 is coupled to the drain of the first transistor 830. The source of the third transistor 840 is coupled to the supply rail, the gate of the third transistor 840 is coupled to the control input 542 of the fourth switch 540 (and hence receives the control signal phi), and the drain of the third transistor 840 is coupled to the source of the second transistor 835.

In operation, when the control signal phi is high, the first transistor 830 is turned on and the third transistor 840 is turned off. As a result, the first transistor 830 couples the source of the second transistor 835 to ground. Because the gate of the second transistor 835 is coupled to the supply rail, the gate-to-source voltage of the second transistor 835 is approximately equal to Vdd, which turns on the second transistor 835. Thus, the first transistor 830 and the second transistor 835 are both turned on, and the output 126 of the first bootstrap circuit 120 is coupled to ground through the first transistor 830 and the second transistor 835. Therefore, the fourth switch 540 couples the output 126 of the first bootstrap circuit 120 to ground when the control signal phi is high (e.g., Vdd).

When the control signal phi is low, the first transistor 830 is turned off and the third transistor 840 is turned on. As a result, the third transistor 840 couples the source of the second transistor 835 to the supply rail. Because the gate of the second transistor 835 is coupled to the supply rail, the gate-to-source voltage of the second transistor 835 is approximately zero volts, which turns off the second transistor 835. As a result, the first transistor 830 and the second transistor 835 are both turned off, and the output 126 of the first bootstrap circuit 120 is decoupled from ground. Therefore, the fourth switch 540 decouples the output 126 of the first bootstrap circuit 120 from ground when the control signal phi is low.

It is to be appreciated that the fourth switch 540 is not limited to the exemplary implementation shown in FIG. 8. For example, the fourth switch 540 may be implemented with other arrangements of transistors, or may be implemented with a single transistor.

FIG. 8 also shows an exemplary implementation of the voltage boost circuit 545 according to certain aspects. In this example, the voltage boost circuit 545 includes a first transistor 850 (e.g., first NFET), a second transistor 855 (e.g., second NFET), a first capacitor 860, and a second capacitor 870. In this example, the drain of the first transistor 850 is coupled to the supply rail, the gate of the first transistor 850 is coupled to the source of the second transistor 855, and the source of the first transistor 850 is coupled to a first terminal 862 of the first capacitor 860. A second terminal 864 of the first capacitor 860 receives the control signal phi_delay, which is provided at the output of the delay circuit 735. The control signal ckboost is provided at the first terminal 862 of the first capacitor 860, as discussed further below.

The drain of the second transistor 855 is coupled to the supply rail, the gate the second transistor 855 is coupled to the source of the first transistor 850, and the source of the second transistor 855 is coupled to a first terminal 872 of the second capacitor 870. A second terminal 874 of the second capacitor 870 receives the control signal phib.

Exemplary operations of the voltage boost circuit 545 will now be described according to certain aspects. In the discussion below, the high voltage of the control signal phib is assumed to be Vdd and the high voltage of the control signal phi_delay is assumed to be Vdd. However, it is to be appreciated that the present disclosure is not limited to this example.

When the control signal phi_delay is low and the control signal phib is high, the first transistor 850 is turned on and the second transistor 855 is turned off. As a result, the first terminal 862 of the first capacitor 860 is charged to the supply voltage Vdd through the first transistor 850. Since the control signal ckboost is provided at the first terminal 862 of the first capacitor 860, the control signal ckboost is approximately Vdd. During this time, the first terminal 872 of the second capacitor 870 is approximately equal to 2Vdd assuming the first terminal 872 of the second capacitor 870 was previously charged to Vdd when the control signal phib was previously low.

When the control signal phi_delay is high and the control signal phib is low, the first transistor 850 is turned off and the second transistor 855 is turned on. In this case, the high voltage of Vdd of the control signal phi_delay is applied to the second terminal 864 of the first capacitor 860. This boosts the voltage at the first terminal 862 of the first capacitor 860 to a boosted voltage of approximately 2Vdd. Since the control signal ckboost is provided at the first terminal 862 of the first capacitor 860, the control signal ckboost is boosted to approximately 2Vdd. During this time, the first terminal 872 of the second capacitor 870 is charged to Vdd through the second transistor 855.

Thus, in this example, the voltage boost circuit 545 boosts the voltage of the control signal phi_delay (e.g., voltage at node 727) by Vdd to generate the control signal ckboost, which has a voltage of approximately 2Vdd when the control signal ckboost is high. The boosted voltage is needed to keep the transistor 815 (e.g., NFET) turned on to charge the first terminal 524 of the boost capacitor 525 to Vdd through the transistor 815. This is because the gate-to-source voltage of the transistor 815 needs to be greater than the threshold voltage of the transistor 815 to keep the transistor 815 turned on, and the source of the transistor 815 is coupled to the first terminal 524 of the boost capacitor 525. Thus, when the voltage at the first terminal 524 of the boost capacitor 525 approaches Vdd (and hence the voltage at the source of the transistor 815 approaches Vdd), the voltage at the gate of the transistor 815 needs to be greater than Vdd by the threshold voltage or more to keep the transistor 815 turned on.

In this example, the control signal ckboost has a low voltage of approximately Vdd. However, the low voltage of Vdd does not turn on the transistor 510 after the first terminal 524 of the boost capacitor 525 is charged to approximately Vdd. This is because the gate-to-source voltage of the transistor 510 is approximately zero volts, which keeps the transistor 510 turned off. The low voltage of Vdd also does not turn on the transistor 510 when the first terminal of 525 of the boost capacitor 525 is boosted to Vdd+Vin0. In this case, the source voltage of the transistor 815 is higher that the gate voltage of the transistor, which keeps the transistor 815 turned off.

In the example shown in FIG. 8, the bootstrap circuit 120 also includes a transistor 880 where the drain of the transistor 880 is coupled to the gate of the transistor 510, the source of the transistor 880 is coupled to the second terminal 527 of the boost capacitor 525, and the gate of the transistor 880 is coupled to the output 126 of the bootstrap circuit 120. The transistor 880 may be implemented with an NFET (as shown in the example in FIG. 8) or another type of transistor.

When the voltage at the output 126 is approximately equal to Vdd+Vin0 during the second phase, the transistor 880 is turned on and couples the gate of the transistor 510 to the second terminal 527 of the boost capacitor 525 through the transistor 880. When the voltage at the output 126 is approximately equal to zero volts during the first phase, the transistor 880 is turned off.

In this example, the transistor 880 helps the transistors 710 and 515 couple the gate of the transistor 510 to the second terminal 527 of the boost capacitor 525 during the second phase. The transistor 880 is able to keep the gate of the transistor 510 coupled to the second terminal 527 of the boost capacitor 525 for cases where the input voltage Vin0 swings high since the transistor 880 is turned by the boosted voltage Vdd+Vin0. It is to be appreciated that the transistor 880 may be omitted in some implementations.

Figure 9A:
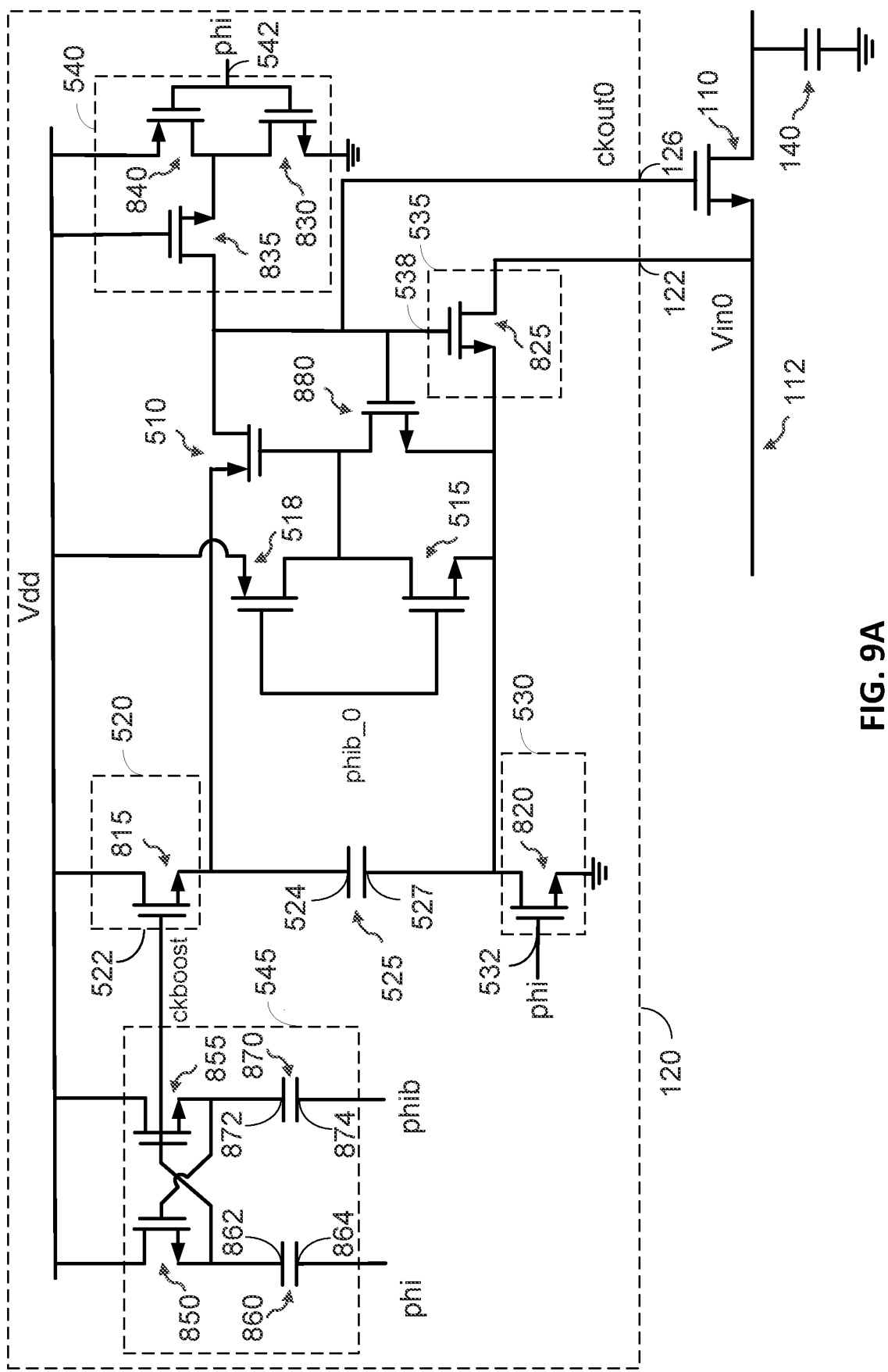
FIG. 9A shows another exemplary implementation of a bootstrap circuit according to certain aspects of the present disclosure.

FIG. 9A shows another example of the bootstrap circuit 120 according to aspects of the present disclosure. In this example, the transistor 710 shown in FIG. 8 is omitted, and the drain of the transistor 515 is coupled to the gate of the transistor 510. Also, in this example, the gates of the transistor 515 and the transistor 518 receive control signal phib_0, and the second terminal 864 of the first capacitor 860 receives the control signal phi.

Figure 9B:
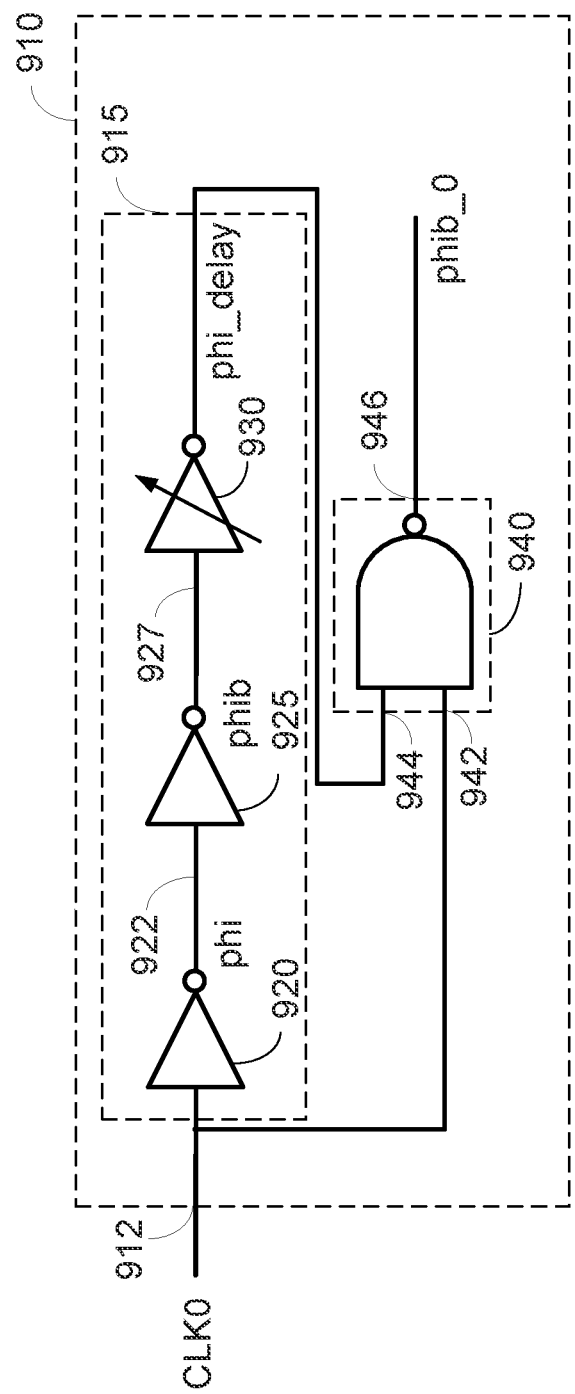
FIG. 9B shows another example of a timing circuit according to certain aspects of the present disclosure.

FIG. 9B shows an example of a timing circuit 910 for generating the control signal phi, the control signal phib, and the control signal phib_0 shown in FIG. 9A. In this example, the timing circuit 910 includes a clock path 915 and a logic gate 940. As shown in the example in FIG. 9A, the clock path 915 may include a first driver 920, a second driver 925, a delay circuit 930 coupled in series. In the example shown in FIG. 9A, the input of the first driver 920 is coupled to an input 912 of the timing circuit 910 to receive the clock signal CLK0, the input of the second driver 925 is coupled to the output of the first driver 920, and the input of the delay circuit 930 is coupled to the output of the second driver 925. In the example shown in FIG. 9B each of the drivers 920 and 925 is implemented with a respective inverter. However, it is to be appreciated that the drivers 920 and 925 are not limited to this example.

The logic gate 940 has a first input 942, a second input 944, and an output 946. In the example shown in FIG. 9B, the logic gate 940 includes a NAND gate. However, it is to be appreciated that the logic gate 940 is not limited to this example. In this example, the first input 942 of the logic gate 940 is coupled to the input 912 of the timing circuit 910 and is configured to receive the clock signal CLK0. The clock path 915 is coupled between the input 912 of the timing circuit 910 and the second input 944 of the logic gate 940.

In this example, the control signal phi is provided by the output of the first driver 920 at node 922, and the control signal phib is provided by the output of the second driver 925 at node 927. Thus, the node 922 is coupled to the control input 532 of the second switch 530 and the control input 542 of the fourth switch 540 to provide the control signal phi.

In the example shown in FIG. 9B, the nodes 922 and 927 are located before the delay circuit 930 in the clock path 915, and the delay circuit 930 is located between the node 927 and the second input 944 of the logic gate 940. Also, in this example, the control signal phib_0 is provided at the output 946 of the logic gate 940 (e.g., NAND gate). Thus, the output 946 is coupled to the gates of the transistors 515 and 518 to provide the control signal phib_0.

In this example, the control signal phi controls the falling edge of the output clock signal ckout0. This is because the control signal phi causes the fourth switch 540 to turn on and couple the output 126 of the first bootstrap circuit 120 to ground when the control signal phi transitions from low to high. As discussed above, the control signal phi is provided by the output of the first driver 920 at the node 922 in the timing circuit 910. Thus, in this example, the clock signal CLK0 propagates through one gate (i.e., the first driver 920) to generate the clock signal phi instead of the three gates shown in FIG. 5B. This significantly reduces the introduction of jitter/skew into the control signal phi, and therefore reduces jitter/skew in the falling edge of the output clock signal ckout0 (which is controlled by the control signal phi).

In this example, the delay circuit 930 and the logic gate 940 (e.g., NAND gate) are configured to generate the control signal phib_0 shown in FIG. 9A. The control signal phib_0 is input to the gates of transistors 515 and 518 to control the rising edge of the output clock signal ckout0. Since the rising edge of the control signal phib_0 is delayed by the delay circuit 930, the rising edge of the output clock signal ckout0 is also delayed by the delay circuit 930.

As shown in FIGS. 9A and 9B, the delay circuit 930, the second driver 925, and the logic gate 940 are located outside the clock path between the input 912 of the timing circuit 910 and the control input 542 of the fourth switch 540. As a result, the delay circuit 930, the second driver 925, and the logic gate 940 (e.g., NAND gate) do not affect the falling edge of the output clock signal ckout0, which reduces jitter/skew in the falling edge of the clock signal ckout0.

Figure 10:
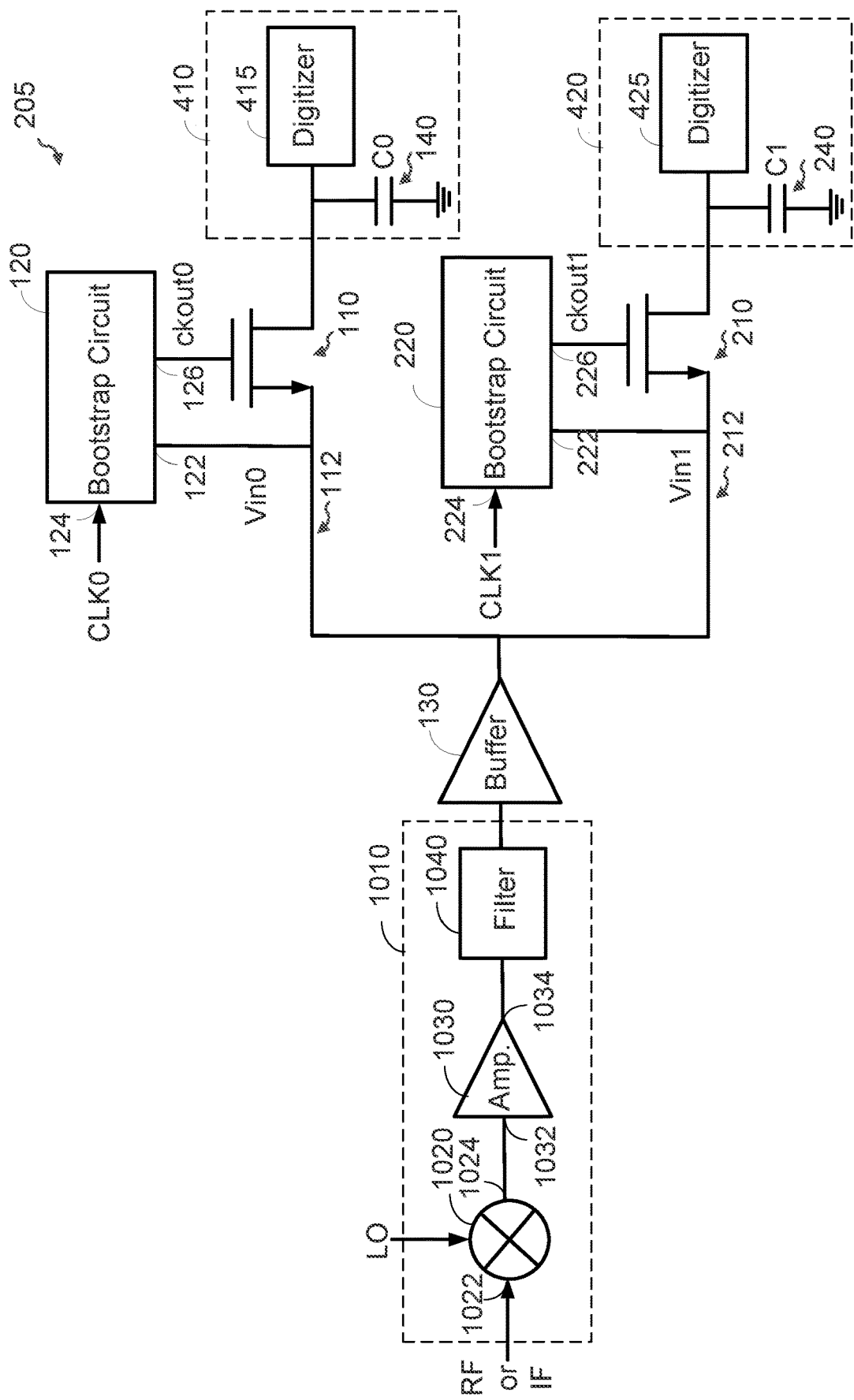
FIG. 10 shows an example of a system including switch transistors, bootstrap circuits, and a receiver according to certain aspects of the present disclosure.

In certain aspects, the system 205 may be used to digitize a signal from a receiver in a wireless device. In this regard, FIG. 10 shows an example of a receiver 1010 coupled to the input of the buffer 130. In this example, the receiver 1010 includes a mixer 1020, an amplifier 1030 (e.g., a transimpedance amplifier), and a filter 1040. The mixer 1020 has an input 1022 and an output 1024. The mixer 1020 is configured to receive a radio frequency (RF) or an intermediate frequency (IF) signal at the input 1022, mix the RF signal or the IF signal with a local oscillator (LO) signal to frequency downconvert the RF signal or the IF signal into a baseband signal, and output the baseband signal at the output 1024. The RF signal may come from an antenna (not shown) and may be processed by one or more front-end components (e.g., low noise amplifier) before being input to the mixer 1020. For the example of the IF signal, the IF signal may come from a preceding mixer (not shown) that downconverts an RF signal into the IF signal.

The amplifier 1030 has an input 1032 coupled to the output 1024 of the mixer 1020, and an output 1034. The amplifier 1030 is configured to amplify the baseband signal from the mixer 1020, and output the amplified baseband signal at the output 1034. The filter 1040 is couped between the output 1034 of the amplifier 1030 and the input of the buffer 130. For example, the filter 1040 may be a low pass filter (e.g., low pass resistor-capacitor (RC) filter) configured to filter out out-of-band signals, and output the filtered baseband signal to the buffer 130. The switch transistors 110 and 210 and the ADCs 410 and 420 may then sample and digitize the baseband signal into a digital baseband signal. The digital baseband signal may be processed by a baseband processor (not shown) to recover data and/or control information from the baseband signal.

Although FIGS. 2, 4 and 10, show the system 205 with two channels, it is to be appreciated that the system 205 may include more than two channels in some implementations (i.e., the system 205 may include one or more additional channels in addition to the channels shown in FIGS. 2, 4, and 10). In general, aspects of the present disclosure may be used in time-interleaved systems with multiple channels where the number of channels may be equal to two or greater than two.

Implementation examples are described in the following numbered clauses:

1. A system, comprising:
   a bootstrap circuit having an input and an output, comprising:
   a boost capacitor having a first terminal and a second terminal;
   a first transistor coupled between the first terminal of the boost capacitor and the output of the bootstrap circuit;
   a second transistor; and
   a third transistor, wherein the second transistor and the third transistor are coupled in series between a gate of the first transistor and the second terminal of the boost capacitor; and
   a switch transistor, wherein a gate of the switch transistor is coupled to the output of the bootstrap circuit, and a terminal of the switch transistor is coupled to the input of the bootstrap circuit.

2. The system of clause 1, wherein the bootstrap circuit further comprises a switch coupled between the output of the bootstrap circuit and a ground.

3. The system of clause 2, wherein the bootstrap circuit further comprises a clock path comprising one or more drivers and a delay circuit coupled in series, wherein:
   a control input of the switch is coupled to a first node on the clock path located before the delay circuit; and
   a gate of the third transistor is coupled to a second node on the clock path located after the delay circuit.

4. The system of clause 3, wherein a gate of the second transistor is coupled to a third node on the clock path located before the delay circuit.

5. The system of clause 4, wherein one of the one or more drivers is between the second node and the third node.

6. The system of clause 4 or 5, wherein:
   the bootstrap circuit further comprises a fourth transistor coupled between the gate of the first transistor and a supply rail; and
   a gate of the fourth transistor is coupled to the third node on the clock path.

7. The system of any one of clauses 3 to 6, wherein the delay circuit has a programmable delay.

8. The system of any one of clauses 3 to 7, wherein each of the one or more drivers includes a respective inverter.

9. The system any one of clauses 1 to 8, wherein:
   the bootstrap circuit further comprises a fourth transistor coupled between the gate of the first transistor and a supply rail;
   the second transistor comprises a first n-type field effect transistor (NFET);
   the third transistor comprises a second NFET; and
   the fourth transistor comprises a p-type field effect transistor (PFET).

10. The system of clause 1, wherein the bootstrap circuit further comprises:
    a first switch coupled between the first terminal of the boost capacitor and a supply rail;
    a second switch coupled between the second terminal of the boost capacitor and a ground;

a third switch coupled between the second terminal of the boost capacitor and the input of the bootstrap circuit; and
a fourth switch coupled between the output of the bootstrap circuit and the ground.
11. The system of clause 10, wherein the bootstrap circuit further comprises a clock path comprising one or more drivers and a delay circuit coupled in series, wherein:
a control input of the second switch and a control input of the fourth switch are coupled to a first node on the clock path located before the delay circuit; and
a gate of the third transistor is coupled to a second node on the clock path located after the delay circuit.
12. The system of clause 11, wherein a gate of the second transistor is coupled to a third node on the clock path located before the delay circuit.
13. The system of clause 12, wherein:
the bootstrap circuit further comprises a fourth transistor coupled between the gate of the first transistor and the supply rail; and a gate of the fourth transistor is coupled to the third node on the clock path.
14. The system of clause 13, further comprising a fifth transistor coupled between the gate of the first transistor and the second terminal of the boost capacitor, wherein a gate of the fifth transistor is coupled to the output of the bootstrap circuit.
15. The system of any one of clauses 11 to 14, wherein the bootstrap circuit further comprises a voltage boost circuit coupled to a control input of the first switch, wherein the voltage boost circuit is configured to boost a voltage at the first node on the clock path to generate a boosted control signal, and output the boosted control signal to the control input of the first switch.
16. The system of any one of clauses 10 to 15, wherein the bootstrap circuit further comprises a voltage boost circuit coupled to a control input of the first switch.
17. The system of any one of clauses 10 to 16, wherein a control input of the third switch is coupled to the output of the bootstrap circuit.
18. The system of any one of clauses 1 to 17, further comprising:
a buffer; and
a sampling capacitor, wherein the switch transistor is coupled between an output of the buffer and the sampling capacitor.
19. The system of clause 18, further comprising a receiver coupled to an input of the buffer.
20. The system of clause 19, wherein the receiver comprises a mixer.
21. A system, comprising:
a bootstrap circuit having an input and an output, comprising:
a boost capacitor having a first terminal and a second terminal;
a first transistor coupled between the first terminal of the boost capacitor and the output of the bootstrap circuit;
a second transistor coupled between a gate of the first transistor and the second terminal of the boost capacitor;
a first switch coupled between the output of the bootstrap circuit and a ground; and
a timing circuit, comprising:
a logic gate having a first input, a second input, and an output, wherein the first input of the logic gate is coupled to an input of the timing circuit, and the output of the logic gate is coupled to a gate of the second transistor; and
a clock path coupled between the input of the timing circuit and the second input of the logic gate, wherein a control input of the first switch is coupled to the clock path; and
a switch transistor, wherein a gate of the switch transistor is coupled to the output of the bootstrap circuit, and a terminal of the switch transistor is coupled to the input of the bootstrap circuit.
22. The system of clause 21, wherein:
the bootstrap circuit further comprises a third transistor coupled between the gate of the first transistor and a supply rail; and
a gate of the third transistor is coupled to the output of the logic gate.
23. The system clause 22, wherein:
the second transistor comprises an n-type field effect transistor (NFET); and
the third transistor comprises a p-type field effect transistor (PFET).
24. The system of any one of clauses 21 to 23, wherein the logic gate comprises a NAND gate.
25. The system of any one of clauses 21 to 24, wherein the clock path comprises one or more drivers and a delay circuit coupled in series, and the control input of the first switch is coupled to a node on the clock path located before the delay circuit.
26. The system of any one of clauses 21 to 25, wherein the bootstrap circuit further comprises:
a second switch coupled between the first terminal of the boost capacitor and a supply rail;
a third switch coupled between the second terminal of the boost capacitor and the ground; and
a fourth switch coupled between the second terminal of the boost capacitor and the input of the bootstrap circuit.
27. The system of clause 26, wherein the clock path comprises one or more drivers and a delay circuit coupled in series, the control input of the first switch and a control input of the third switch are coupled to a node on the clock path located before the delay circuit.
28. The system of clause 27, wherein the bootstrap circuit further comprises a voltage boost circuit coupled to a control input of the second switch, and wherein the voltage boost circuit is configured to boost a voltage at the node on the clock path to generate a boosted control signal, and output the boosted control signal to the control input of the second switch.
29. The system of any one of clauses 26 to 28, wherein a control input of the fourth switch is coupled to the output of the bootstrap circuit.
30. The system of any one of clauses 26 to 39, wherein the bootstrap circuit further comprises a voltage boost circuit coupled to a control input of the second switch.
31. The system of clause 22 or 23, further comprising a fourth transistor coupled between the gate of the first transistor and the second terminal of the boost capacitor, wherein a gate of the fourth transistor is coupled to the output of the bootstrap circuit.

It is to be appreciated that the present disclosure is not limited to the terminology used above to describe aspects of the present disclosure. For example, a buffer may also be referred to as a driver, an amplifier, or another term. A switch transistor may also be referred to as a switch, a transistor, a bootstrap switch, a bootstrapped switch, a sampling switch (e.g., in the context of analog-to-digital conversion), or another term. A bootstrap circuit may also be referred to as a bootstrap switch, a boost circuit, or another term. In general, a bootstrap circuit covers any circuit configured to drive the gate of a switch transistor with a boosted voltage that tracks the voltage of a signal in a signal path (e.g., voltage at a terminal (e.g., source) of the switch transistor). It is also to be appreciated that a bootstrap circuit and a switch transistor may also collectively be referred to as a bootstrap switch.

It is to be appreciated that a transistor may be physically implemented on a chip using two or more transistors arranged in parallel in which the gates of the two or more transistors are coupled together.

Within the present disclosure, the word "exemplary" is used to mean "serving" as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   a bootstrap circuit having an input and an output, comprising:
   a boost capacitor having a first terminal and a second terminal;
   a first transistor coupled between the first terminal of the boost capacitor and the output of the bootstrap circuit;
   a second transistor;
   a third transistor, wherein the second transistor and the third transistor are coupled in series between a gate of the first transistor and the second terminal of the boost capacitor;
   a switch coupled between the output of the bootstrap circuit and a ground; and
   a clock path comprising one or more drivers and a delay circuit coupled in series, wherein:
   a control input of the switch is coupled to a first node on the clock path located before the delay circuit, and
   a gate of the third transistor is coupled to a second node on the clock path located after the delay circuit; and
   a switch transistor, wherein a gate of the switch transistor is coupled to the output of the bootstrap circuit, and a terminal of the switch transistor is coupled to the input of the bootstrap circuit.

2. The system of claim 1, wherein a gate of the second transistor is coupled to a third node on the clock path located before the delay circuit.

3. The system of claim 2, wherein one of the one or more drivers is between the second node and the third node.

4. The system of claim 2, wherein:
   the bootstrap circuit further comprises a fourth transistor coupled between the gate of the first transistor and a supply rail; and
   a gate of the fourth transistor is coupled to the third node on the clock path.

5. The system of claim 1, wherein the delay circuit has a programmable delay.

6. The system of claim 1, wherein each of the one or more drivers includes a respective inverter.

7. The system claim 1, wherein:
   the bootstrap circuit further comprises a fourth transistor coupled between the gate of the first transistor and a supply rail;
   the second transistor comprises a first n-type field effect transistor (NFET);
   the third transistor comprises a second NFET; and
   the fourth transistor comprises a p-type field effect transistor (PFET).

8. The system of claim 1, wherein the bootstrap circuit further comprises:
   a first switch coupled between the first terminal of the boost capacitor and a supply rail;
   a second switch coupled between the second terminal of the boost capacitor and a ground;
   a third switch coupled between the second terminal of the boost capacitor and the input of the bootstrap circuit; and
   a fourth switch coupled between the output of the bootstrap circuit and the ground.

9. A system, comprising:
   a bootstrap circuit having an input and an output, comprising:
   a boost capacitor having a first terminal and a second terminal;
   a first transistor coupled between the first terminal of the boost capacitor and the output of the bootstrap circuit;
   a second transistor;
   a third transistor, wherein the second transistor and the third transistor are coupled in series between a gate of the first transistor and the second terminal of the boost capacitor;
   a first switch coupled between the first terminal of the boost capacitor and a supply rail;
   a second switch coupled between the second terminal of the boost capacitor and a ground;
   a third switch coupled between the second terminal of the boost capacitor and the input of the bootstrap circuit;
   a fourth switch coupled between the output of the bootstrap circuit and the ground; and
   a clock path comprising one or more drivers and a delay circuit coupled in series, wherein:
   a control input of the second switch and a control input of the fourth switch are coupled to a first node on the clock path located before the delay circuit; and
   a gate of the third transistor is coupled to a second node on the clock path located after the delay circuit; and a switch transistor, wherein a gate of the switch transistor is coupled to the output of the bootstrap circuit, and a terminal of the switch transistor is coupled to the input of the bootstrap circuit.

10. The system of claim 9, wherein a gate of the second transistor is coupled to a third node on the clock path located before the delay circuit.

11. The system of claim 10, wherein:
the bootstrap circuit further comprises a fourth transistor coupled between the gate of the first transistor and the supply rail; and
a gate of the fourth transistor is coupled to the third node on the clock path.

12. The system of claim 9, wherein the bootstrap circuit further comprises a voltage boost circuit coupled to a control input of the first switch, wherein the voltage boost circuit is configured to boost a voltage at the first node on the clock path to generate a boosted control signal, and output the boosted control signal to the control input of the first switch.

13. The system of claim 8, wherein the bootstrap circuit further comprises a voltage boost circuit coupled to a control input of the first switch.

14. The system of claim 8, wherein a control input of the third switch is coupled to the output of the bootstrap circuit.

15. A system, comprising:
a bootstrap circuit having an input and an output, comprising:
  a boost capacitor having a first terminal and a second terminal;
  a first transistor coupled between the first terminal of the boost capacitor and the output of the bootstrap circuit;
  a second transistor; and
  a third transistor, wherein the second transistor and the third transistor are coupled in series between a gate of the first transistor and the second terminal of the boost capacitor;
a switch transistor, wherein a gate of the switch transistor is coupled to the output of the bootstrap circuit, and a terminal of the switch transistor is coupled to the input of the bootstrap circuit;
a buffer; and
a sampling capacitor, wherein the switch transistor is coupled between an output of the buffer and the sampling capacitor.

16. The system of claim 15, further comprising a receiver coupled to an input of the buffer.

17. The system of claim 16, wherein the receiver comprises a mixer.

* * * * *